(12) United States Patent
Honda

(10) Patent No.: US 12,212,288 B2
(45) Date of Patent: Jan. 28, 2025

(54) HARMONIC PROCESSING CIRCUIT AND AMPLIFICATION DEVICE

(71) Applicant: SUMITOMO ELECTRIC INDUSTRIES, LTD., Osaka (JP)

(72) Inventor: Ayumu Honda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 497 days.

(21) Appl. No.: 17/726,655

(22) Filed: Apr. 22, 2022

(65) Prior Publication Data

US 2022/0407470 A1 Dec. 22, 2022

(30) Foreign Application Priority Data

Jun. 18, 2021 (JP) ................................. 2021-101836

(51) Int. Cl.
| | |
|---|---|
| H03F 3/191 | (2006.01) |
| H03F 1/32 | (2006.01) |
| H03F 1/56 | (2006.01) |
| H03F 3/04 | (2006.01) |

(52) U.S. Cl.
CPC ............... *H03F 1/32* (2013.01); *H03F 1/565* (2013.01); *H03F 3/04* (2013.01); *H03F 2200/222* (2013.01); *H03F 2200/387* (2013.01)

(58) Field of Classification Search
CPC ..................................................... H03F 3/191
USPC .................................................. 330/302, 305
See application file for complete search history.

(56) References Cited

U.S. PATENT DOCUMENTS

| | | | | |
|---|---|---|---|---|
| 10,541,653 | B2* | 1/2020 | Zhu | H03F 1/565 |
| 10,742,174 | B2* | 8/2020 | Roberts | H03F 3/245 |
| 11,444,586 | B2* | 9/2022 | Roberts | H03F 1/565 |
| 11,463,055 | B2* | 10/2022 | Li | H03F 3/2171 |
| 11,705,872 | B2* | 7/2023 | Roberts | H03F 3/213 |
| | | | | 330/277 |
| 2004/0041634 | A1 | 3/2004 | Sugiura | |

FOREIGN PATENT DOCUMENTS

| | | |
|---|---|---|
| JP | 2000-165163 A | 6/2000 |
| JP | 2004-096379 A | 3/2004 |
| JP | 2010-232988 A | 10/2010 |
| JP | 2014-072557 A | 4/2014 |

OTHER PUBLICATIONS

Japanese Office Action issued on Oct. 1, 2024 for Japanese Patent Application No. 2021-101836.

* cited by examiner

*Primary Examiner* — Henry Choe
(74) *Attorney, Agent, or Firm* — Volpe Koenig

(57) ABSTRACT

A harmonic processing circuit includes a first inductor having a first end connected to a connection line connected between an amplifier and an impedance matching circuit, and a second end connected to a first node, a first transmission line having a third end connected to the first node and a fourth end connected to a second node, and a parallel resonant circuit having a fifth end connected to the second node and a sixth end connected to a reference potential, wherein a second inductor and a first capacitor are connected in parallel between the fifth end and the sixth end, wherein when the first inductor is viewed from the connection line, an impedance at a frequency of a fundamental wave amplified by the amplifier is larger than an impedance at a frequency of a second harmonic having twice the frequency of the fundamental wave.

8 Claims, 27 Drawing Sheets

FIG. 15

| PHASE ROTATION AMOUNT θ OF TARGET [°] | 10 | 40 | 70 | 100 | 130 | 160 |
|---|---|---|---|---|---|---|
| D2[°] | | | 0~5 | 0~9 | 0~8.5 | 0~8 |
| L1[nH] | | | 0.5 | 1.3 | 2.4 | 3 |
| L2[nH] | | | 6 | 6 | 6 | 6 |
| C1[pF] | | | 0.2 | 0.2 | 0.2 | 0.2 |
| D1[°] | | | 1.4 | 1.4 | 1.4 | 1.4 |
| PHASE ROTATION AMOUNT θ OF TARGET [°] | 190 | 220 | 250 | 280 | 310 | 340 |
| D2[°] | 0~8 | 0~7.5 | 0~7.5 | 0~7.5 | 0~7 | 0~7 |
| L1[nH] | 3.4 | 3.8 | 4.2 | 4.7 | 5.3 | 6 |
| L2[nH] | 6 | 6 | 6 | 6 | 6 | 6 |
| C1[pF] | 0.2 | 0.2 | 0.2 | 0.2 | 0.2 | 0.2 |
| D1[°] | 1.4 | 1.4 | 1.4 | 1.4 | 1.4 | 1.4 |

| PHASE ROTATION AMOUNT θ OF TARGET [°] | 10 | 40 | 70 | 100 | 130 | 160 |
|---|---|---|---|---|---|---|
| D1 [°] | ✗ | ✗ | 5.4 | 5.4 | 5.4 | 5.4 |
| PHASE ROTATION AMOUNT θ OF TARGET [°] | 190 | 220 | 250 | 280 | 310 | 340 |
| D1 [°] | 6.4 | 6.4 | 6.9 | ✗ | ✗ | ✗ |

| PHASE ROTATION AMOUNT θ OF TARGET [°] | 10 | 40 | 70 | 100 | 130 | 160 |
|---|---|---|---|---|---|---|
| D1 [°] | ✗ | ✗ | 8.4 | 8.4 | 8.4 | 8.4 |
| PHASE ROTATION AMOUNT θ OF TARGET [°] | 190 | 220 | 250 | 280 | 310 | 340 |
| D1 [°] | 8.4 | 8.4 | 8.4 | 8.4 | 8.4 | ✗ |

| PHASE ROTATION AMOUNT θ OF TARGET [°] | 10 | 40 | 70 | 100 | 130 | 160 |
|---|---|---|---|---|---|---|
| D1 [°] | ✗ | ✗ | 2.9~19.4 | 3.4~19.4 | 3.4~19.4 | 3.9~19.4 |
| PHASE ROTATION AMOUNT θ OF TARGET [°] | 190 | 220 | 250 | 280 | 310 | 340 |
| D1 [°] | 4.4~19.4 | 4.9~19.4 | 5.4~19.4 | 5.9~19.4 | 6.9~19.4 | ✗ |

HARMONIC PROCESSING CIRCUIT AND AMPLIFICATION DEVICE

CROSS REFERENCE TO RELATED APPLICATIONS

This application claims priority based on Japanese Patent Application No. 2021-101836 filed on Jun. 18, 2021, and the entire contents of the Japanese patent applications are incorporated herein by reference.

FIELD

The present disclosure relates to a harmonic processing circuit and an amplification device.

BACKGROUND

There has been known a harmonic processing circuit that grounds the harmonics of a fundamental wave amplified by the amplification device, among high-frequency signals input to and output from the amplification device (e.g., Patent Document 1: Japanese Laid open Patent Publication No. 2014-72557).

SUMMARY

A harmonic processing circuit according to the present disclosure includes a first inductor having a first end connected to a connection line connected between an amplifier and an impedance matching circuit, and a second end connected to a first node; a first transmission line having a third end connected to the first node and a fourth end connected to a second node; and a parallel resonant circuit having a fifth end connected to the second node and a sixth end connected to a reference potential, wherein a second inductor and a first capacitor are connected in parallel between the fifth end and the sixth end; wherein when the first inductor is viewed from the connection line, an impedance at a frequency of a fundamental wave amplified by the amplifier is larger than an impedance at a frequency of a second harmonic having twice the frequency of the fundamental wave.

BRIEF DESCRIPTION OF DRAWINGS

FIG. 15 is a diagram illustrating a range of a length D2 in which resonance points f1 and f2 can be adjusted, with respect to a phase rotation amount θ of a target in the simulation 4.

FIGS. 23A to 23C are diagrams illustrating a range of a length D1 in which the resonance points f1 and f2 can be adjusted, with respect to the phase rotation amount θ of the target in the simulation 6.

DETAILED DESCRIPTION OF EMBODIMENTS

Figure 1:
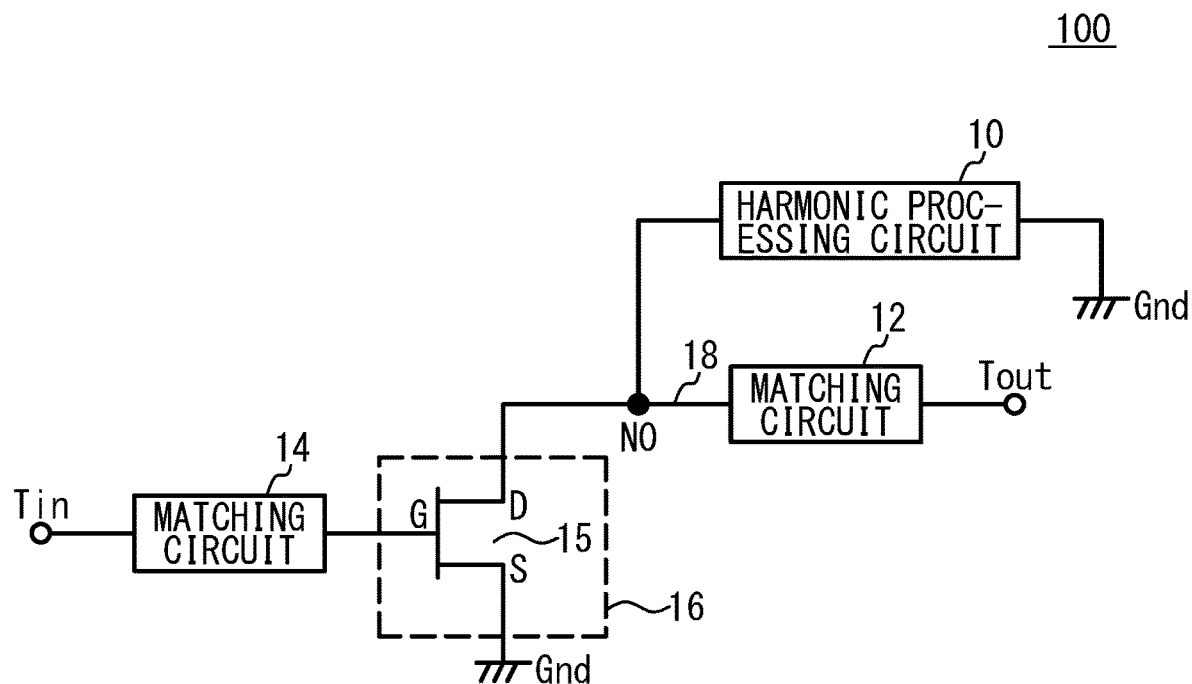
FIG. 1 is a circuit diagram illustrating an amplification device according to a first embodiment.

Values of an inductance and a capacitor for an inductor and a capacitor used in the harmonic processing circuit may not be continuously selectable. For example, in chip components such as a chip inductor and a chip capacitor, the values of the inductance and the capacitance are fixed and cannot be selected freely. Therefore, the desired performance of the harmonic processing circuit may not be obtained.

It is an object of the present disclosure to provide a harmonic processing circuit and an amplification device that have a desired performance.

Description of Embodiments of the Present Disclosure

First, the contents of the embodiments of this disclosure are listed and explained.

(1) A harmonic processing circuit according to the present disclosure includes: a first inductor having a first end connected to a connection line connected between an amplifier and an impedance matching circuit, and a second end connected to a first node; a first transmission line having a third end connected to the first node and a fourth end connected to a second node; and a parallel resonant circuit having a fifth end connected to the second node and a sixth end connected to a reference potential, wherein a second inductor and a first capacitor are connected in parallel between the fifth end and the sixth end; wherein when the first inductor is viewed from the connection line, an impedance at a frequency of a fundamental wave amplified by the amplifier is larger than an impedance at a frequency of a second harmonic having twice the frequency of the fundamental wave. This makes it possible to provide the harmonic processing circuit having a desired performance.

(2) The harmonic processing circuit may further include a second transmission line having a seventh end connected to the connection line and an eighth end connected to a third node. The first end of the first inductor may be connected to the third node. A length of the first transmission line may correspond to 45° or less of a phase of the fundamental wave, and a length of the second transmission line may correspond to 9° or less of the phase of the fundamental wave.

(3) The second inductor may be a chip inductor, and the first capacitor may be a parasitic capacitance component of the chip inductor.

(4) A length of the first transmission line may correspond to 2.9° or more of a phase of the fundamental wave.

(5) The second inductor may be a chip inductor, and the first capacitor may be a parasitic capacitance component of the chip inductor. A length of the first transmission line may correspond to 8° or more of a phase of the fundamental wave. The first end of the first inductor may be directly connected to the connection line, or may be connected to the connection line via a second transmission line having a length corresponding to 1° or less of the phase of the fundamental wave.

(6) The second inductor may have a ninth end connected to a bias terminal that supplies a bias voltage to the amplifier.

(7) The harmonic processing circuit further may include a second capacitor having a tenth end connected to a fourth node between the sixth end of the second inductor and the bias terminal, and an eleventh end connected to the reference potential.

(8) One embodiment of the present disclosure is an amplification device including the harmonic processing circuit and the amplifier. This makes it possible to provide the amplification device having a desired performance.

Details of Embodiments of the Present Disclosure

Specific examples of the harmonic processing circuit and the amplification device in accordance with embodiments of the present disclosure are described below with reference to the drawings. The present disclosure is not limited to these examples, but is indicated by the claims, which are intended to include all modifications within the meaning and scope of the claims.

First Embodiment

FIG. 1 is a circuit diagram illustrating an amplification device according to a first embodiment. As illustrated in FIG. 1, in an amplification device 100, an amplifier 16 includes, for example, a transistor 15. The transistor 15 is, for example, a FET (Field Effect Transistor), for example, a GaN FET or an LDMOS (Laterally Diffused Metal Oxide Semiconductor). The amplifier 16 may include a plurality of stages of transistors 15.

An input terminal Tin to which the high frequency signal is input is connected to a gate G of the transistor 15 via a matching circuit 14. The matching circuit 14 is a circuit that matches an input impedance when the inside of the amplification device 100 is viewed from the outside of the amplification device 100 through the input terminal Tin, to an input impedance when the inside of the amplifier 16 is viewed via the gate G. A source S of the transistor 15 is connected to a ground Gnd. A drain D of the transistor 15 is connected through the matching circuit 12 to an output terminal Tout where the amplifier 16 outputs an amplified high-frequency signal. A matching circuit 12 is a circuit that matches an output impedance when the outside of the amplification device 100 is viewed through the drain D of the transistor 15, to an output impedance when the outside of the amplification device 100 is viewed through the output terminal Tout.

A node N0 in a line 18 connecting between the drain D and the matching circuit 12 is connected to the ground Gnd via the harmonic processing circuit 10. A high frequency signal in a band amplified by the amplifier 16 is used as a fundamental wave. The frequency of the fundamental wave is, for example, a center frequency of the band of the amplifier 16. The fundamental wave is impedance-matched in the matching circuit 12 and output from the output terminal Tout. It is preferable that a harmonic component of the fundamental wave (e.g. double wave or second harmonic having twice the frequency of the fundamental wave) is not output from the output terminal Tout. Therefore, the harmonic processing circuit 10 passes the second harmonic through the ground Gnd. On the other hand, if the harmonic processing circuit 10 passes the fundamental wave, a loss will occur. Therefore, the harmonic processing circuit 10 reflects the fundamental wave without passing it through.

Figure 2:
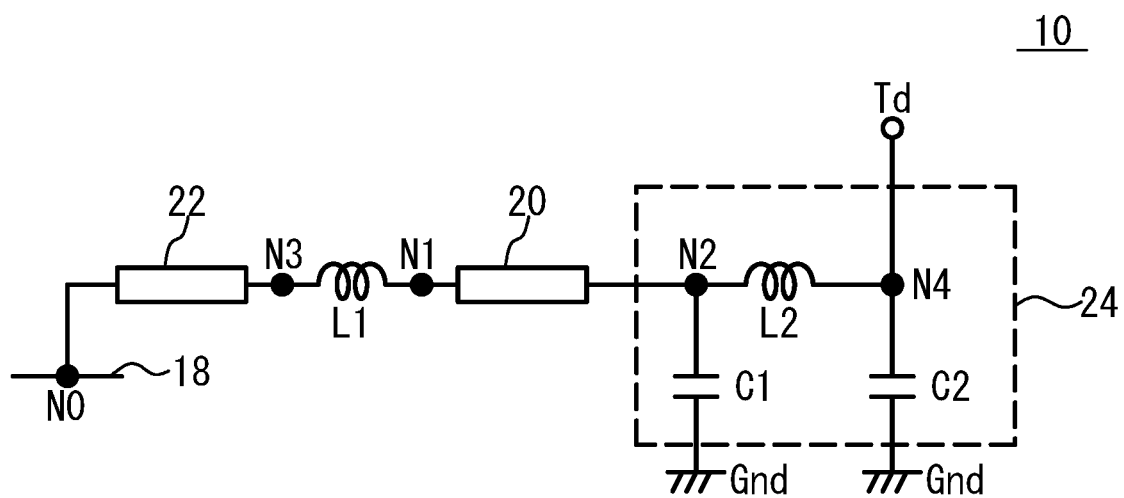
FIG. 2 is a circuit diagram illustrating a harmonic processing circuit and a matching circuit according to the first embodiment.

FIG. 2 is a circuit diagram illustrating the harmonic processing circuit and the matching circuit according to the first embodiment. As illustrated in FIG. 2, in the harmonic processing circuit 10, one end (seventh end) of a transmission line 22 is connected to the node N0 and the other end (eighth end) of the transmission line 22 is connected to a node N3. One end (first end) of an inductor L1 is connected to the node N3, and the other end (second end) of the inductor L1 is connected to a node N1. One end (third end) of the transmission line 20 is connected to the node N1 and the other end (fourth end) of the transmission line 20 is connected to a node N2.

One end (fifth end) of a parallel resonant circuit 24 is connected to the node N2, and the other end (sixth end) of the parallel resonant circuit 24 is connected to the ground Gnd (reference potential). In the parallel resonant circuit 24, one end of the inductor L2 is connected to the node N2 and the other end of the inductor L2 is connected to a node N4. One end of the capacitor C1 is connected to the node N2 and the other end of the capacitor C1 is connected to the ground Gnd. One end of a capacitor C2 is connected to the node N4 and the other end of the capacitor C2 is connected to the ground Gnd. The node N4 is connected to a bias terminal Td that supplies a bias voltage (i.e., a drain bias voltage) to the amplifier 16.

The parallel resonant circuit 24 mainly resonates in parallel by the inductor L2 and the capacitor C2. The capacitor C2 is a DC (Direct Current) cut capacitor between the bias terminal Td and the ground Gnd, and has a capacitance that does not affect the fundamental wave and the second harmonic so much. The inductors L1 and L2 also function as choke coils for supplying the bias voltage to the amplifier 16.

Figure 3A:
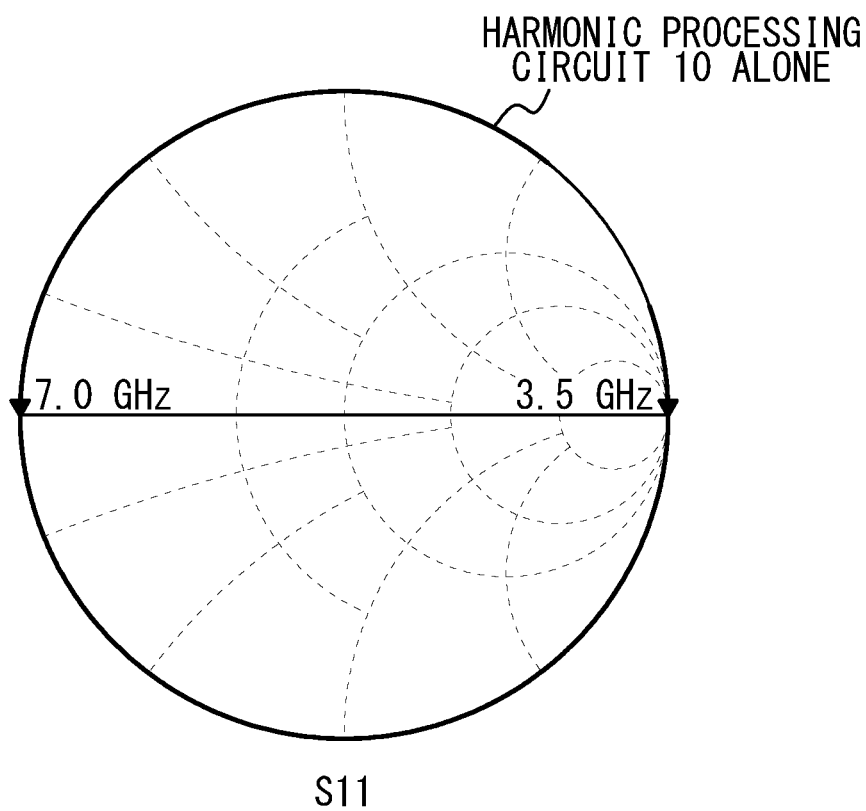
FIG. 3A is a diagram illustrating a Smith chart of S11 of the harmonic processing circuit.
Figure 3B:
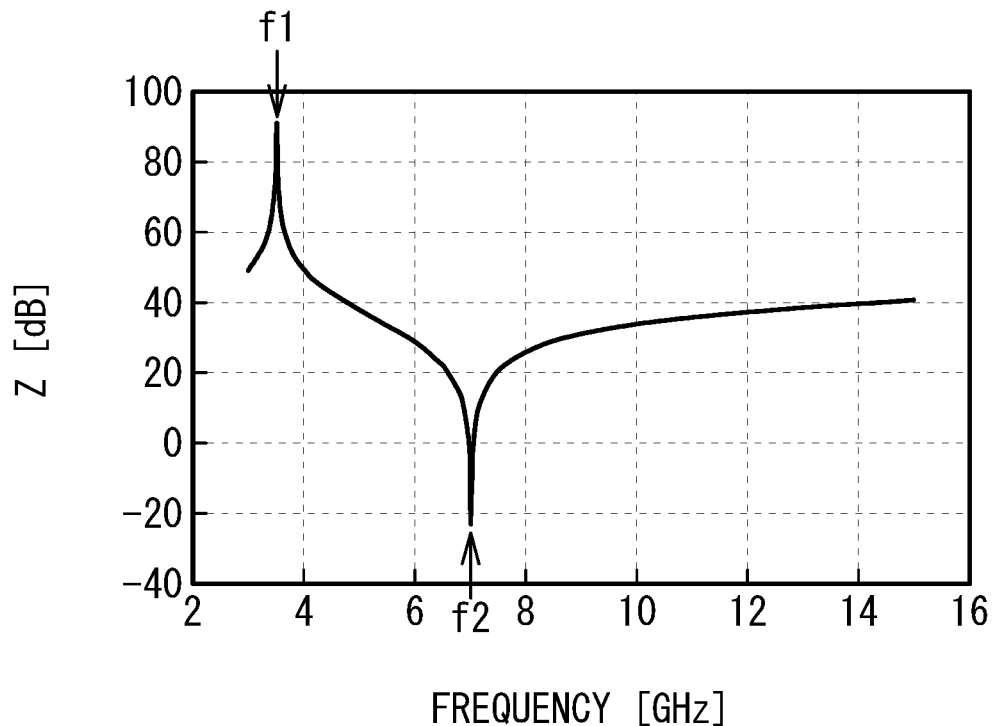
FIG. 3B is a diagram illustrating a magnitude of an impedance with respect to a frequency.

The ideal performance of the harmonic processing circuit 10 alone when the matching circuit 12 is not connected to the amplification device 100 will be described. FIG. 3A is a diagram illustrating a Smith chart of S11 of the harmonic processing circuit, and FIG. 3B is a diagram illustrating a magnitude of an impedance with respect to a frequency. FIG. 3A is the Smith chart of S11 when the harmonic processing circuit 10 is viewed from the node N0 in a state where the matching circuit 12 is not connected. FIG. 3B is a diagram illustrating a magnitude of an impedance Z when the harmonic processing circuit 10 is viewed from the node N0 to with respect to the frequency. Here, the impedance Z is a magnitude of the impedance of a complex number. The frequency is swept from 3 GHz to 15 GHz. The frequency of the fundamental wave is 3.5 GHz, and the frequency of the second harmonic is 7.0 GHz. Note that "S11" is a parameter corresponding to an input reflectance coefficient in the S parameter.

As illustrated in FIG. 3A, when the frequency of the fundamental wave is 3.5 GHz, S11 has a phase of almost 0° and is located near the outer circumference of the circle of the Smith chart. At this time, the impedance Z of the harmonic processing circuit 10 is almost infinite, and the harmonic processing circuit 10 is in a substantially open state. As illustrated in FIG. 3B, a resonance point f1 in the open state in which the impedance Z increases at a frequency of the fundamental wave of 3.5 GHz is formed. The resonance point f1 in the open state is the resonance point of the parallel resonant circuit 24, and is formed by parallel resonance due to an inductive reactance component of the inductor L2 and the capacitor C2 and a capacitive reactance component of the capacitor C1. When the resonance point f1 is located on a high frequency side than the fundamental wave frequency of 3.5 GHz, the phase of S11 moves from 0° to a position rotated counterclockwise as illustrated in the Smith chart of FIG. 3A as it is located on the higher frequency side than the frequency of the fundamental wave of 3.5 GHz.

As illustrated in FIG. 3A, when the frequency of the second harmonic is 7.0 GHz, S11 has a phase of approximately 180° (that is, −180°) and is located near the outer circumference of the circle of the Smith chart. At this time, the harmonic processing circuit 10 is in a state where the impedance Z is almost 0 (short). As illustrated in FIG. 3B, the impedance Z becomes small at the frequency 7.0 GHz of the second harmonic, and the resonance point f2 in a short state is formed. The resonance point f2 in the short state is formed by series resonance due to the inductive reactance component of the inductor L1 and the capacitive reactance component of the capacitors C1 and C2 of the parallel resonant circuit 24. When the resonance point f2 is located on the high frequency side than the frequency of the second harmonic of 7.0 GHz, in the Smith chart of FIG. 3A, the phase of S11 moves from 180° to a position further counterclockwise as it is located on the higher frequency side than the frequency of the fundamental wave of 3.5 GHz.

As described above, when the harmonic processing circuit 10 is viewed from the node N0, the harmonic processing circuit 10 is in a substantially open state at the frequency of the fundamental wave, and is in a substantially short state at the frequency of the second harmonic. Thereby, the fundamental wave is reflected by the harmonic processing circuit 10, and the second harmonic is grounded via the harmonic processing circuit 10. Therefore, the amplification device 100 can suppress the loss in the fundamental wave and suppress the second harmonic.

Figure 4:
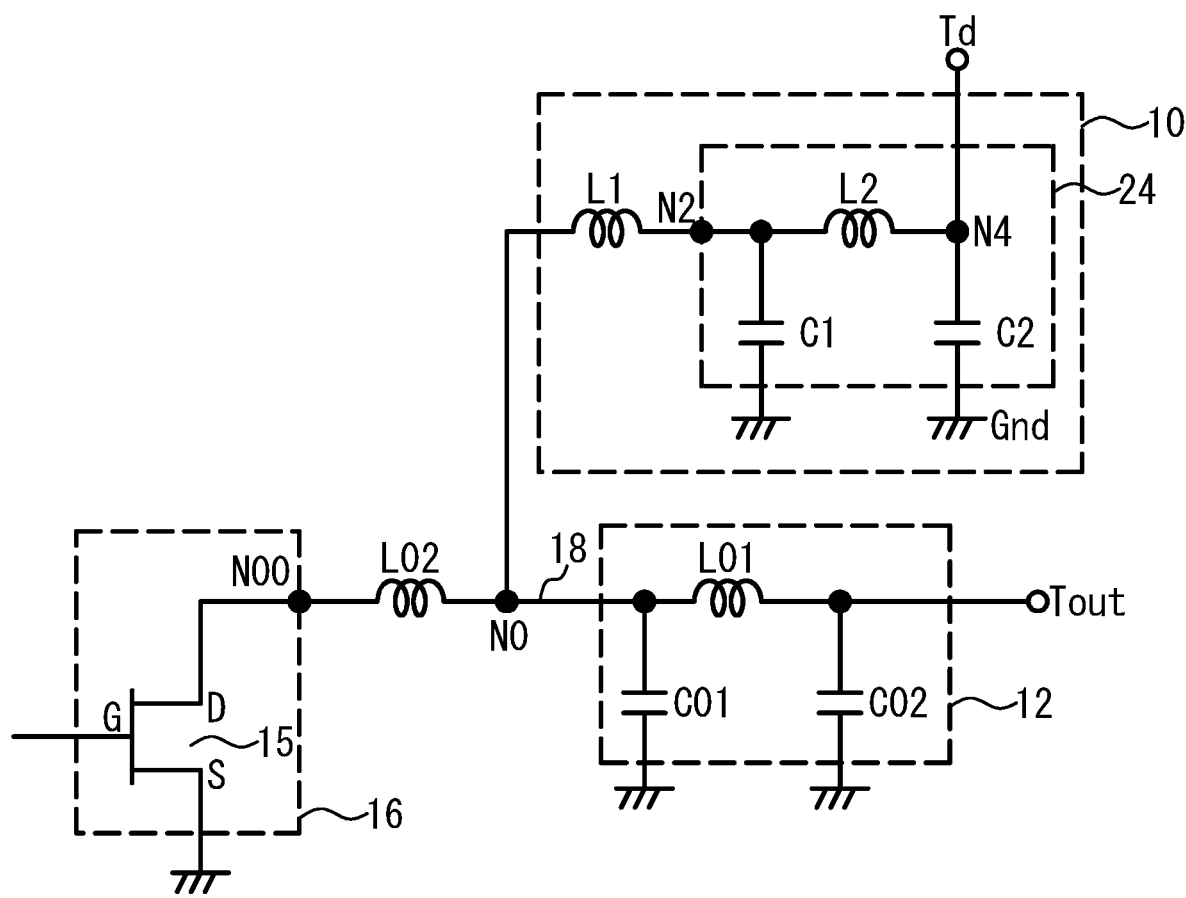
FIG. 4 is a circuit diagram illustrating a harmonic processing circuit and a matching circuit in a first comparative example used in the simulation.

Next, the problem of the harmonic processing circuit when the matching circuit 12 is connected will be described. FIG. 4 is a circuit diagram illustrating the harmonic processing circuit and the matching circuit in a first comparative example used in the simulation. As illustrated in FIG. 4, a π-type CLC circuit is provided as the matching circuit 12. In the matching circuit 12, the inductor L01 is connected in series to the line 18, and capacitors C01 and C02 are shunt-connected from an inductor L01 to the ground Gnd. An inductor L02 is connected between an output node N00 (drain D) of the amplifier 16 and a node N0. The inductor L02 corresponds to, for example, a bonding wire. The harmonic processing circuit 10 is not provided with transmission lines 20 and 22. Other circuit configurations are the same as those in the first embodiment.

Simulation 1

In the first comparative example, S11 when the matching circuit 12 was viewed from the output node N00 of the amplifier 16 was simulated. The simulation conditions are as follows. The same code is used for the inductor and the inductance, and another same code is used for the capacitor and the capacitance. For example, the inductance of the inductor L1 is L1.

Figure 5:
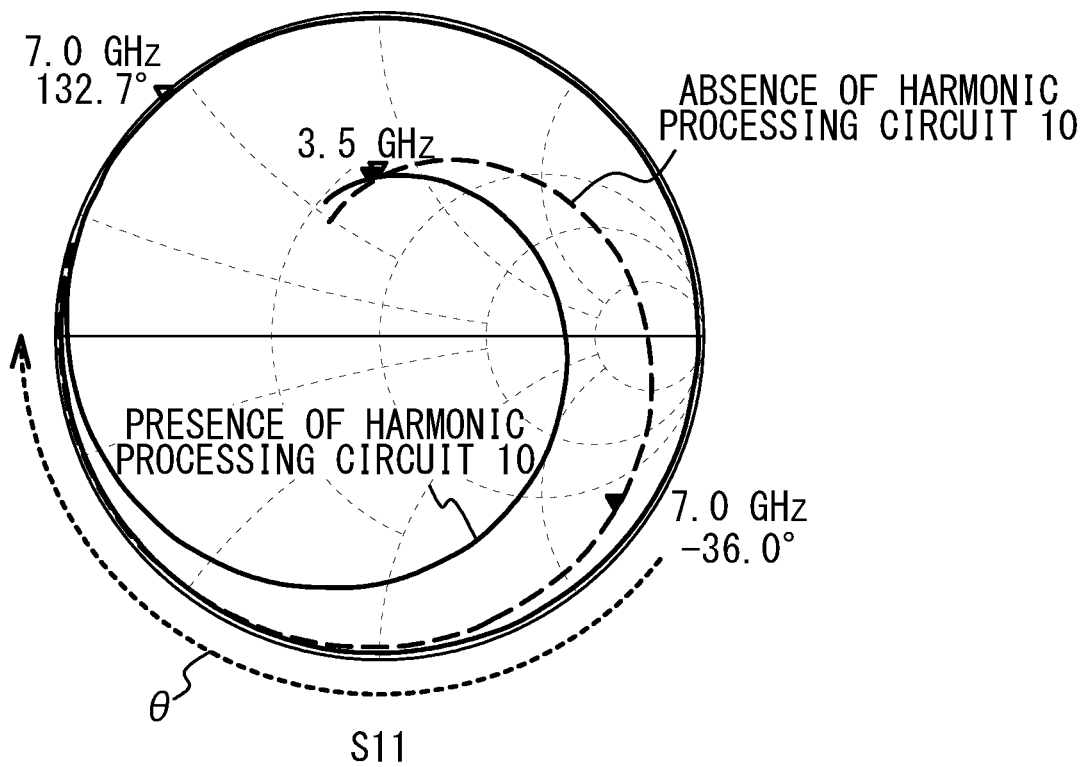
FIG. 5 is a Smith chart of S11 when the matching circuit is viewed from an output node of an amplifier in a simulation 1.

Frequency of fundamental wave: 3.5 GHz
Frequency of second harmonic: 7.0 GHz
Harmonic processing circuit 10
L1: 1.355 nH
L2: 4.42 nH
C1: 0.5 pF
C2: 7 pF
Matching circuit 12
L01: 2.3 nH
C01: 0.4 pF
C02: 1.2 pF
L02: 0.5 nH
Output terminal Tout: 50Ω termination FIG. 5 is a Smith chart of S11 when the matching circuit 12 is viewed from the output node of the amplifier in the simulation 1. A broken line represents S11 when the harmonic processing circuit 10 is not connected, and a solid line represents S11 when the harmonic processing circuit 10 is connected. A marker of 3.5 GHz represents the frequency of the fundamental wave, and a marker of 7.0 GHz represents the frequency of the second harmonic. The same applies to the following similar figures.

When the harmonic processing circuit 10 is not connected, the matching circuit 12 is impedance-matched so as to optimize the performance (efficiency, power, distortion, and so on) of the amplification device 100 in the fundamental wave, as illustrated in FIG. 5. On the other hand, the phase of S11 of the second harmonic is not 180°. As a result, the second harmonic is output from the amplification device 100.

When the harmonic processing circuit 10 is connected, S11 of the fundamental wave is almost unchanged. This is because the harmonic processing circuit 10 is in the open state in the fundamental wave when the harmonic processing circuit 10 is viewed from the node N0. By connecting the harmonic processing circuit 10, the phase of S11 in the second harmonic is rotated clockwise as illustrated by a broken arrow, and the target is to set the phase of S11 around 180°. By connecting the harmonic processing circuit 10, the phase of S11 of the second harmonic, which rotates clockwise, is defined as a phase rotation amount θ.

Figure 6A:
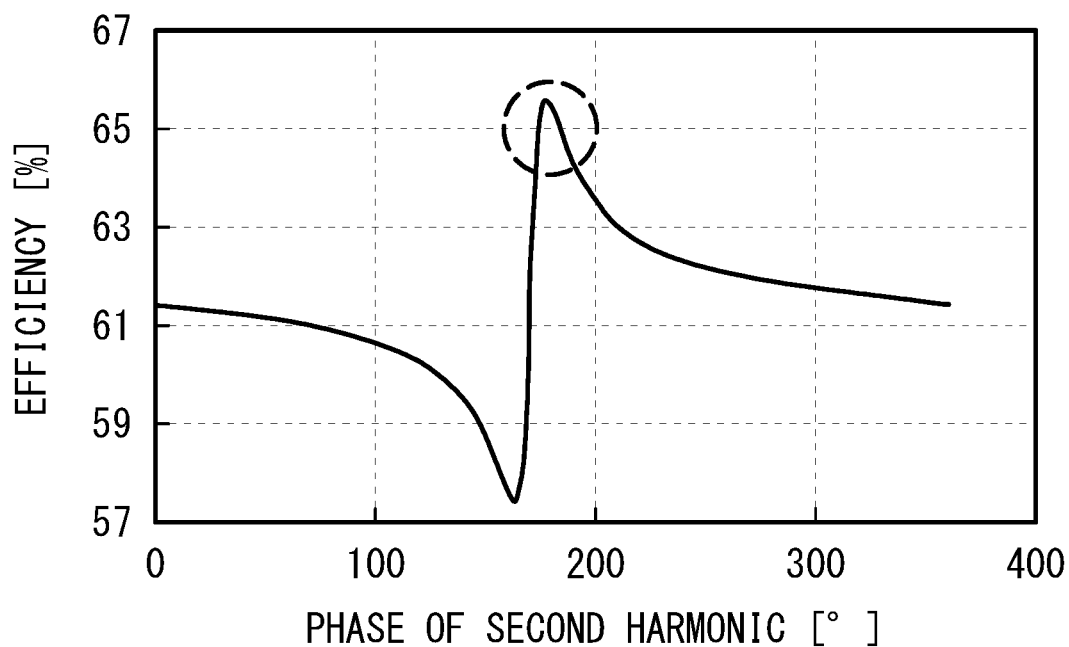
FIGS. 6A and 6B are diagrams illustrating an efficiency of the amplification device with respect to a phase of a second harmonic in the simulation 1.
Figure 6B:
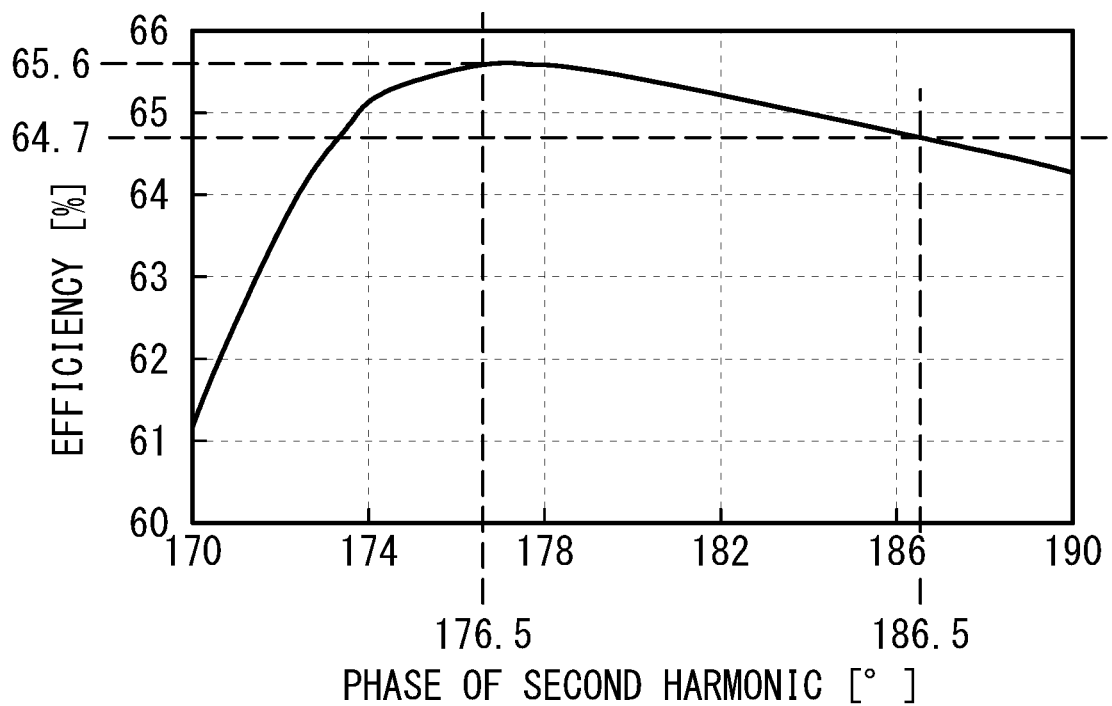

The efficiency of the amplification device 100 with respect to the phase of S11 in the second harmonic when the output side was viewed from the node N00 was simulated. FIGS. 6A and 6B are diagrams illustrating the efficiency of the amplification device 100 with respect to the phase of the second harmonic in the simulation 1. The efficiency is a drain efficiency. FIG. 6B is an enlarged view of the vicinity of a broken line circle where the efficiency of FIG. 6A is maximized. As illustrated in FIG. 6B, when the phase of the second harmonic is 176.5°, the efficiency is 65.6% at the maximum. When the phase of the second harmonic deviates from 176.5° by 10° to 186.5°, the efficiency drops to 64.7%.

The values of the inductance for inductors and the capacitance for capacitors may not be continuously selectable. For example, the inductance of a chip inductor and the capacitance of a chip capacitor can only be selected as discrete values. Therefore, the phase of the second harmonic may deviate from a desired phase, and the performance of the amplification device 100 may not be optimized. Therefore, in the first embodiment, the transmission lines 20 and 22 are provided.

Simulation 2

Lengths D1 and D2 of the transmission lines 20 and 22 were changed to simulate the changes in the resonance points f1 and f2 in the harmonic processing circuit 10. The lengths D2 and D1 of the transmission lines 20 and 22 are represented by the angle of phase of the fundamental wave. The simulation conditions are as follows.

L1: 1.3 nH
L2: 4.4 nH
C1: 0.5 pF
C2: 7 pF
Characteristic impedance of transmission lines 20 and 22: 50Ω

Figure 7A:
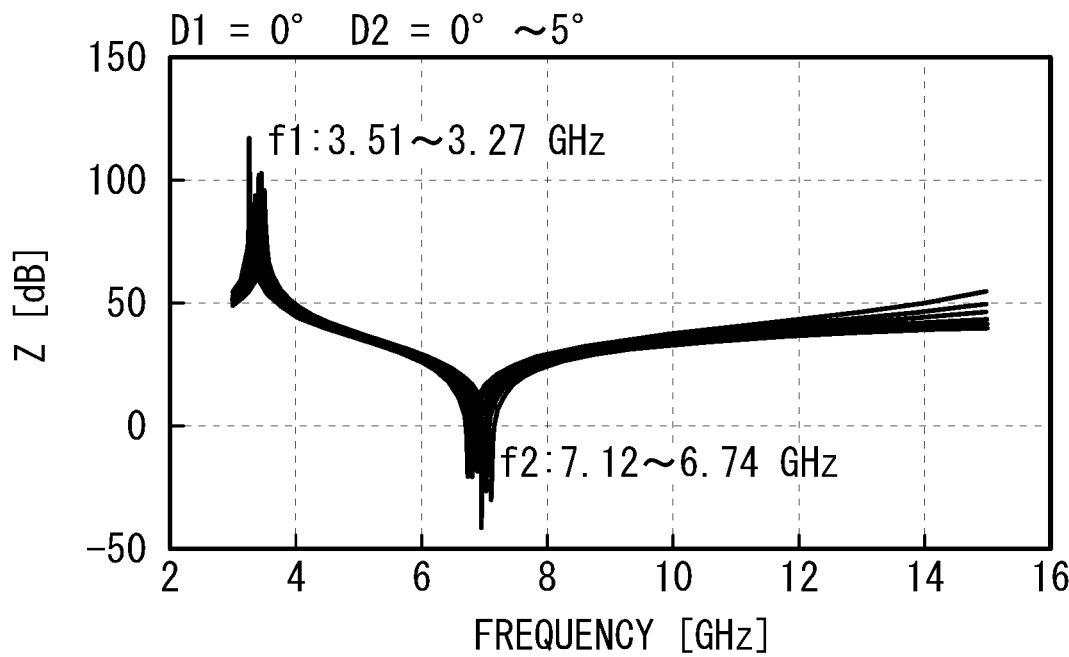
FIGS. 7A and 7B are diagrams illustrating the magnitude of the impedance with respect to the frequency when lengths of transmission lines are changed in a simulation 2.
Figure 7B:
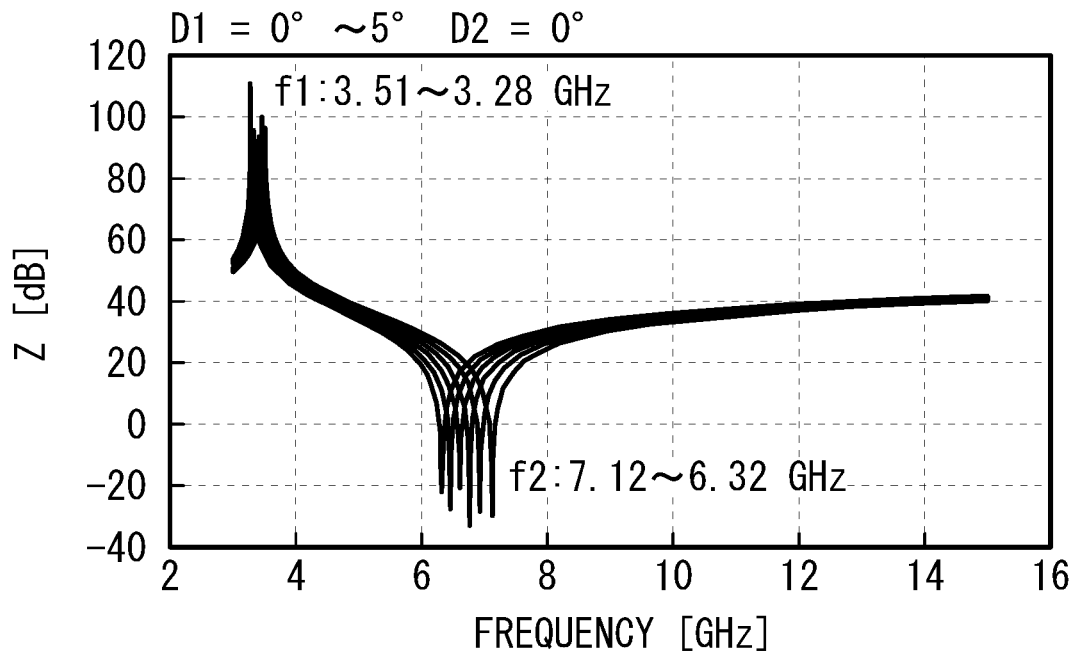

FIGS. 7A and 7B are diagrams illustrating the magnitude of the impedance with respect to the frequency when the lengths of the transmission lines are changed in the simulation 2. FIG. 7A is a diagram when the length D1 of the transmission line 20 is set to 0° and the length D2 of the transmission line 22 is changed from 0° to 5°. FIG. 7B is a diagram when the length D2 of the transmission line 22 is set to 0° and the length D1 of the transmission line 20 is changed from 0° to 5°.

When the lengths D1 and D2 of the transmission lines 20 and 22 are lengthened, the frequencies of the resonance points f1 and f2 are both lowered, as illustrated in FIGS. 7A and 7B. When the length D2 of the transmission line 22 is set from 0° to 5°, the resonance point f1 changes from 3.51 GHz to 3.27 GHz, which is lowered by 0.24 GHz, as illustrated in FIG. 7A. The resonance point f2 changes from 7.12 GHz to 6.74 GHz, which is lowered by 0.38 GHz. In this way, when the length D2 of the transmission line 22 is changed, both the resonance points f1 and f2 change. When the length D1 of the transmission line 20 is set from 0° to 5°, the resonance point f1 changes from 3.51 GHz to 3.28 GHz, which is lowered by 0.23 GHz, as illustrated in FIG. 7B. The resonance point f2 changes from 7.12 GHz to 6.32 GHz, which is lowered by 0.8 GHz. In this way, when the length D1 of the transmission line 20 is changed, the resonance point f2 mainly changes rather than the resonance point f1. As described above, the frequencies of the resonance points f1 and f2 can be adjusted by adjusting the lengths D1 and D2 of the transmission lines 20 and 22.

Simulation 3

Assuming that the values of the inductance and the capacitance of the components in the first comparative example and the first embodiment are discrete, the conditions in which the phase of the second harmonic approaches the maximum efficiency of 176.5° as illustrated in FIGS. 6A and 6B were simulated by using an optimization function of a simulator. The circuit diagram of the simulated first comparative example is the same as that of FIG. 4.

Figure 8:
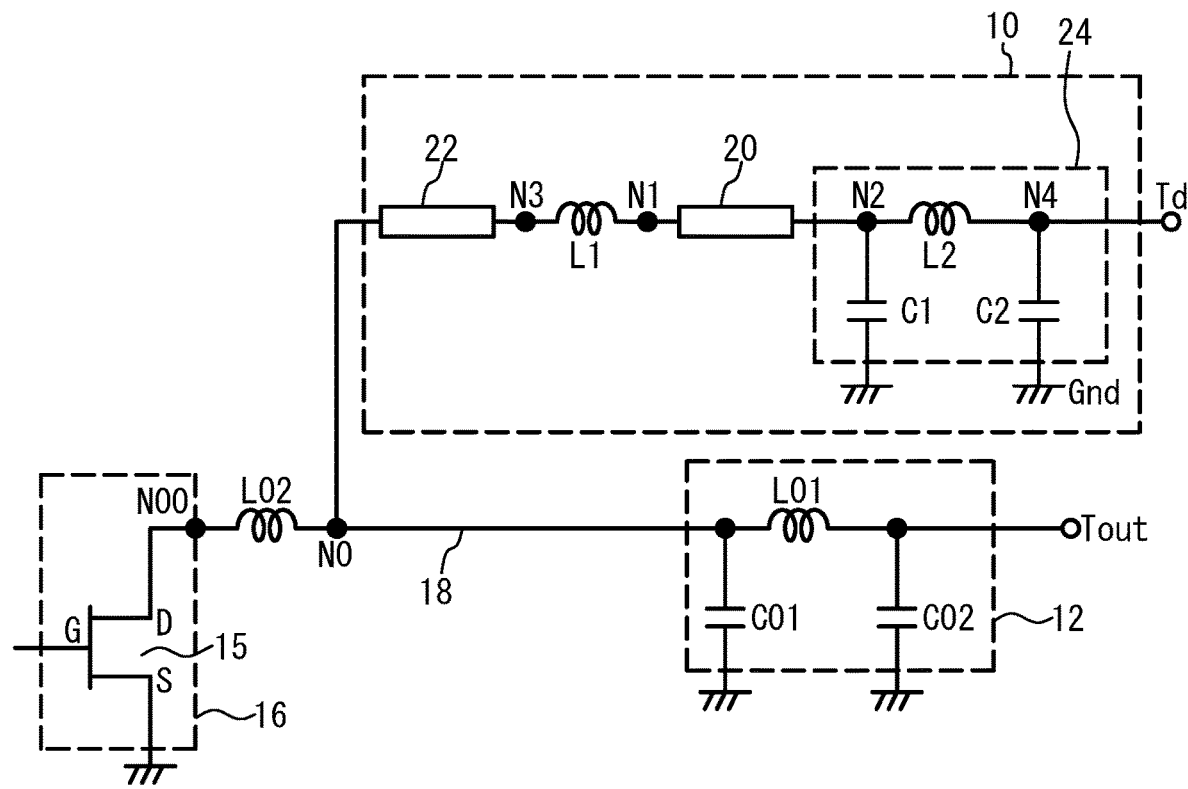
FIG. 8 is a circuit diagram illustrating the matching circuit and the harmonic processing circuit in the first embodiment used in a simulation 3.

FIG. 8 is a circuit diagram illustrating the matching circuit and the harmonic processing circuit in the first embodiment used in the simulation 3. As illustrated in FIG. 8, the transmission line 22 is connected between the nodes N0 and N3, and the transmission line 20 is connected between the nodes N1 and N2. Other circuit configurations are the same as those in FIG. 4.

The simulation conditions are as follows.
Frequency of fundamental wave: 3.5 GHz
Frequency of second harmonic: 7.0 GHz
Harmonic processing circuit 10
L1: 0.5 nH to 6 nH, in increments of 0.1 nH
L2: 6 nH to 10 nH, in increments of 0.1 nH
C1: 0.2 pF to 10 pF, in increments of 0.1 pF
C2: 7 pF (fixed)
Characteristic impedance of transmission lines 20 and 22: 50Ω
Matching circuit 12
L01: 2.3 nH
C01: 0.4 pF
C02: 1.2 pF
L02: 0.5 nH
Output terminal Tout: 50Ω termination In the first embodiment, the lengths of the transmission lines 20 and 22 can be adjusted. The lengths (electrical lengths) of the transmission lines 20 and 22 are expressed by the phase angle of the fundamental wave 3.5 GHz. The lengths of the transmission lines 20 and 22 when the phase angle is 360° correspond to one wavelength. A phase angle 5° of the fundamental wave 3.5 GHz corresponds to about 0.71 mm. Assuming that a placement accuracy of the component is ±0.05 mm, a phase adjustment accuracy is ±0.5°.

Figure 9:
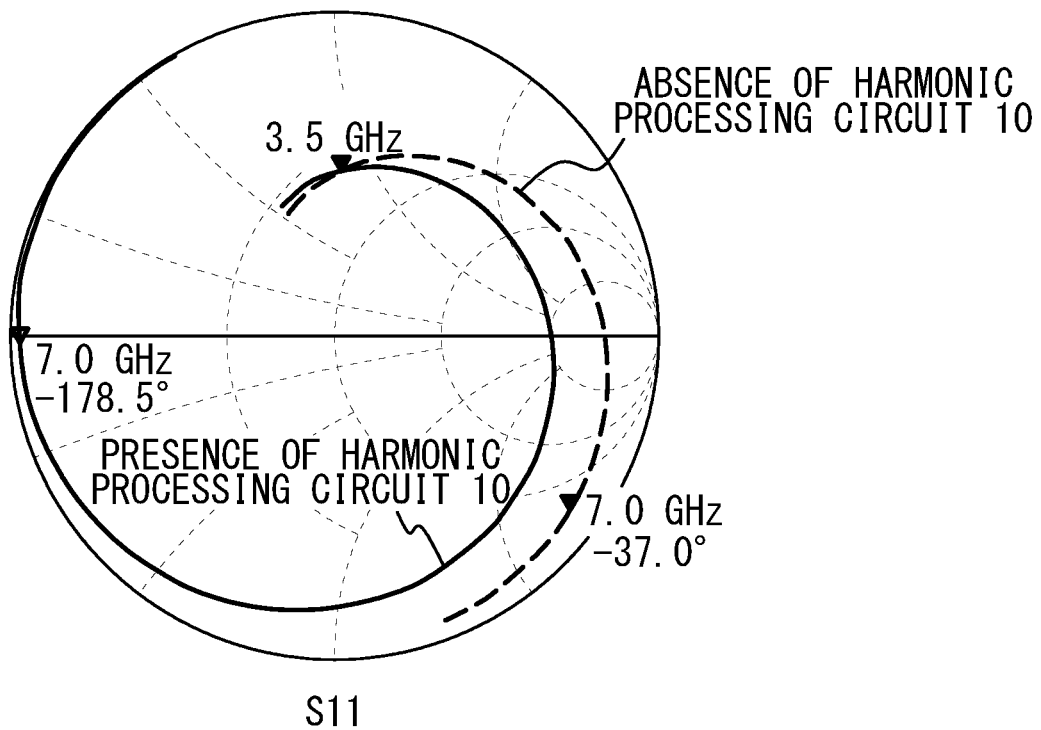
FIG. 9 is a Smith chart of S11 when the matching circuit 12 is viewed from the output node of the amplifier according to the first comparative example in the simulation 3.

FIG. 9 is a Smith chart of S11 when the matching circuit 12 is viewed from the output node of the amplifier according to the first comparative example in the simulation 3. FIG. 9 illustrates S11 in a case where the harmonic processing circuit 10 is provided and not provided using each of the optimized constants. As illustrated in FIG. 9, the phase of the second harmonic 7.0 GHz is about −37.0° when the harmonic processing circuit 10 is not provided. By providing the harmonic processing circuit 10, the phase of the second harmonic 7.0 GHz can be set to −178.5° (181.5°). Values such as inductances and capacitances of respective optimized components are as follows.

L1: 1.7H
L2: 7.0 nH
C1: 0.3 pF
C2: 7 pF (fixed)

Figure 10:
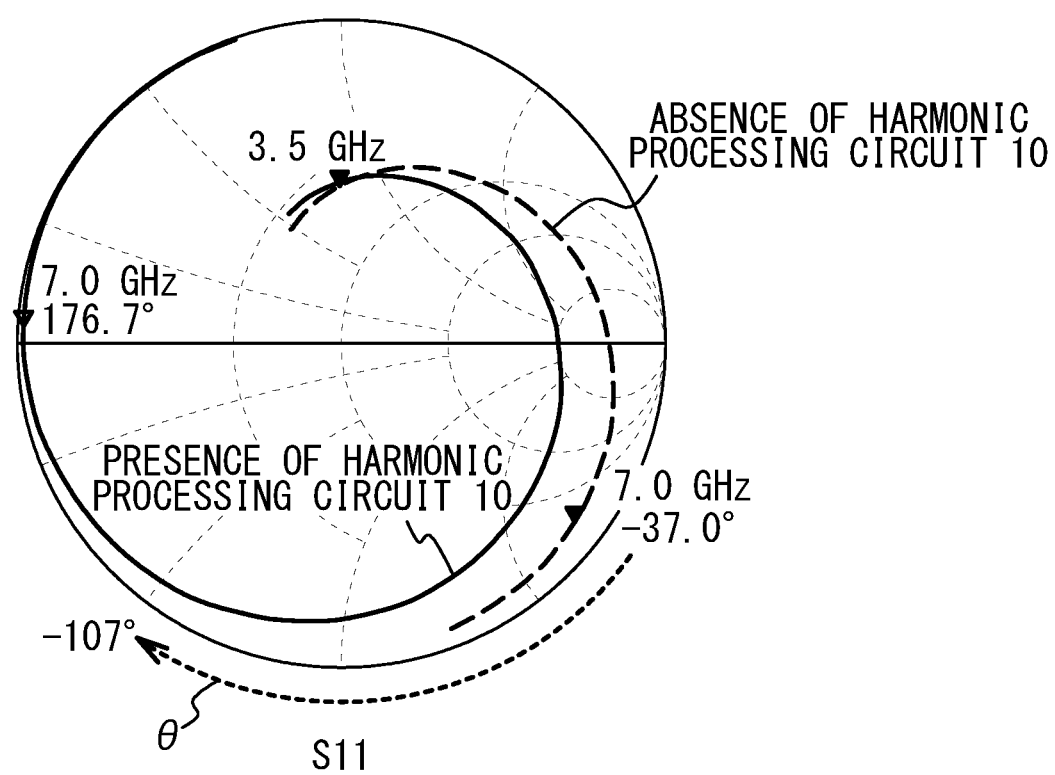
FIG. 10 is a Smith chart of S11 when the matching circuit 12 is viewed from the output node of the amplifier according to the first embodiment in the simulation 3.

FIG. 10 is a Smith chart of S11 when the matching circuit 12 is viewed from the output node of the amplifier according to the first embodiment in the simulation 3. As illustrated in FIG. 10, S11 in the case where the harmonic processing circuit 10 is not provided is the same as that in the first comparative example. By providing the harmonic processing circuit 10, the phase of the second harmonic 7.0 GHz can be set to 176.7°. Values such as inductances, capacitances and lengths of respective optimized components are as follows.

L1: 1.8H
L2: 7.5 nH
C1: 0.2 pF
C2: 7 pF (fixed)
D1: 5°
D2: 0°

Figure 11:
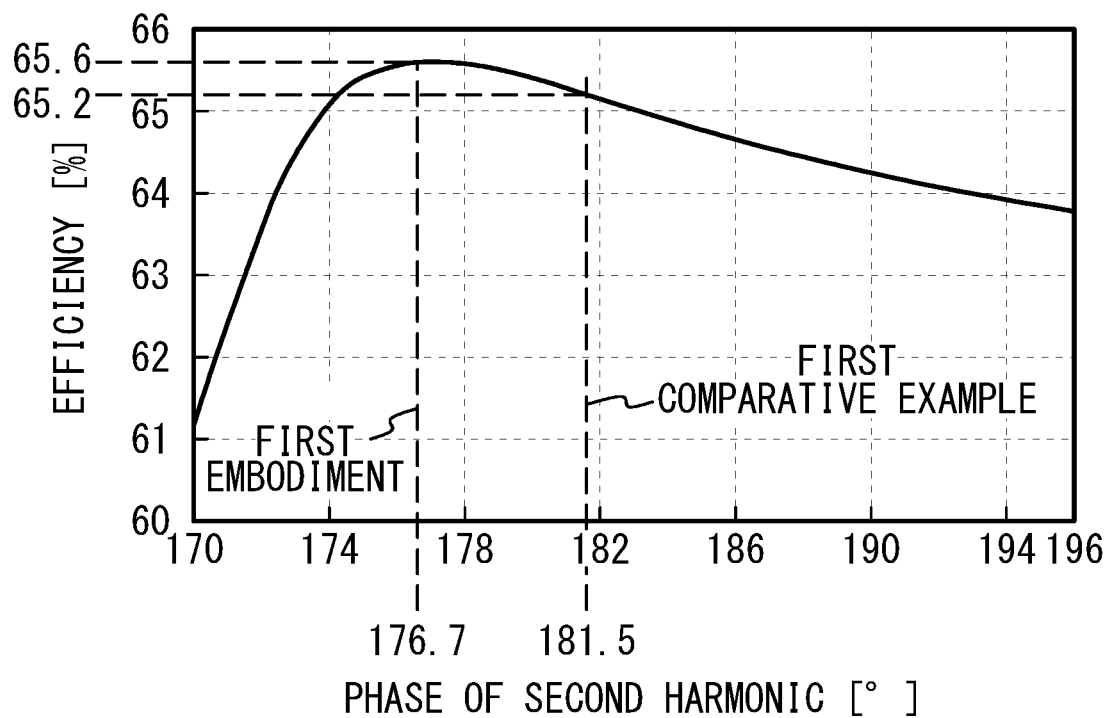
FIG. 11 is a diagram illustrating an efficiency of the amplification device with respect to the phase of the second harmonic in the simulation 3.

FIG. 11 is a diagram illustrating an efficiency of the amplification device 100 with respect to the phase of the second harmonic in the simulation 3. As illustrated in FIG. 11, in the first comparative example, the phase of the second harmonic is 181.5° and the efficiency is 65.2%. In the first embodiment, the phase of the second harmonic is 176.7° and the efficiency is 65.6%. As described above, in the first embodiment, by providing the transmission lines 20 and 22, the phase of the second harmonic can be accurately adjusted even if the values of the inductances L1 and L2 and the capacitance C1 are discrete. Thereby, the performance of the amplification device 100 can be improved.

According to the first embodiment, one end of the transmission line 22 (second transmission line) is connected to the line 18, and the other end of the transmission line 22 is connected to the node N3 (third node). One end of the inductor L1 (first inductor) is connected to the node N3, and the other end of the inductor L1 is connected to the node N1 (first node). One end of the transmission line 20 (first transmission line) is connected to the node N1 and the other end of the transmission line 20 is connected to the node N2 (second node). The parallel resonant circuit 24 has the inductor L2 (second inductor) having one end connected to the node N2 and the other end connected to the node N4, the capacitor C2 (second capacitor) having one end connected to the node N4 and the other end connected to the ground Gnd (reference potential), and the capacitor C1 (first capacitor) having one end connected to the node N2 and the other end connected to the ground Gnd (reference potential). The series connection of the inductor L2 (second inductor) and the capacitor C2 (second capacitor), and the capacitor C1 (first capacitor) are connected in parallel between the node N2 and the ground Gnd (reference potential). Here, the transmission line 22 may not be provided. That is, one end of the inductor L1 may be directly connected to the line 18.

When the inductor L1 is viewed from the line 18, the impedance at the frequency of the fundamental wave is larger than the impedance at the frequency of the second harmonic. Thereby, since the harmonic processing circuit 10 reflects the fundamental wave, the fundamental wave propagates through the matching circuit 12. Since the harmonic processing circuit 10 passes the second harmonic to the ground, the second harmonic does not propagate through the matching circuit 12. Therefore, the input of the second harmonic to the amplifier 16 or the output of the second harmonic from the amplifier 16 can be suppressed. Therefore, the harmonic processing circuit 10 and the amplification device 100 can have desired performance. The impedance at the frequency of the fundamental wave is preferably 10 dB or more larger than the impedance of the harmonic, more preferably 20 dB or more, and further preferably 40 dB or more.

The parallel resonant circuit 24 resonates in parallel at the frequency of the fundamental wave, and the inductor L1 and the parallel resonant circuit 24 resonate in series at the frequency of the second harmonic. Thereby, the impedance at the frequency of the fundamental wave can be made larger than the impedance at the frequency of the second harmonic. Note that to resonate in parallel at the frequency of the fundamental wave, it is sufficient that the frequency of the fundamental wave is located in a band where the impedance increases due to the parallel resonance. To resonate in series at the frequency of the second harmonic, it is sufficient that the frequency of the second harmonic is located in a band where the impedance decreases due to the series resonance.

By providing the transmission lines 20 and 22, even if the values of the inductors L1 and L2 and the capacitor C1 are discrete, the resonance points of the parallel resonance and the series resonance can be set to desired frequencies. Therefore, the performance of the amplification device 100 can be improved.

The other end (ninth end) of the inductor L2 is connected to the bias terminal Td that supplies the bias voltage to the amplifier 16. Thereby, the inductors L1 and L2 can be used as the choke inductors. Therefore, the number of components can be reduced.

One end (tenth end) of the capacitor C2 (second capacitor) is connected to a node (fourth node) between the other end of the inductor L2 and the bias terminal Td, and the other end (eleventh end) of the capacitor C2 is connected to the ground. Thereby, the capacitor C2 can be used for DC cutting.

Simulation 4

In the first embodiment, when the length D2 of the transmission line 22 is set to 9° or more without depending on the phase rotation amount θ of S11 of the second harmonic 7.0 GHz to be rotated by providing the harmonic processing circuit 10, it was found that the resonance points f1 and f2 could not be adjusted to the fundamental and the second harmonic by adjusting the values of the other components. The simulation 4 showing this was performed. In the simulation 4, the simulation was performed manually without using the optimization function of the simulator. The procedure of simulation 4 will be described.

The adjustment ranges of respective values of the respective components are as follows.

L1: 0.5 nH to 6 nH, in increments of 0.1 nH
L2: 6 nH to 10 nH, in increments of 0.5 nH
C1: 0.2 pF to 2 pF, in increments of 0.1 pF
C2: 7 pF (fixed)
D1: 1.4° to 45°, in increments of 0.5°
D2: In increments of 0.5°
Characteristic impedance of transmission lines 20 and 22: 50Ω
Matching circuit 12: same as matching circuit 12 in the simulation 3

Each value is set in the range where the desired characteristics can be obtained with the fundamental wave and the second harmonic. Since the inductor L2 is used as the choke inductor, a minimum value of the inductance is set to 6 nH. Since the harmonic processing circuit 10 becomes large when the transmission line 20 is long, a maximum value of the length D1 of the transmission line 20 is set to 45°. Assuming that a minimum spacing when mounting the components on a substrate is 0.2 mm, the minimum spacing of the length D2 of the transmission line 22 is 0.2 mm. When the frequency of the fundamental wave is 3.5 GHz, D2 is 1.4°. Therefore, the minimum value of D2 is set to 1.4°. Since the capacitor C2 is for DC cut of the bias voltage, it was fixed at 7 pF. The reactance component of the capacitor C2 in the fundamental wave is set to be smaller than the reactance component of the capacitor C1 and the inductor L1. Therefore, changing the capacitance C2 does not significantly affect the following simulation.

Step 1: In the harmonic processing circuit 10 alone, the value of each component is adjusted so that the phase of S11 at the frequency 3.5 GHz of the fundamental wave when viewed from the node N0 is in the range of ±2° from the position of the resonance point f1 (i.e., the position where the phase of S11 is 0°). As inductances L1 and L2, the capacitance C1, and the lengths D1 and D2 become larger, the frequency of the resonance point f1 becomes lower, and as the inductances L1 and L2, the capacitance C1, and the length D2 and D1 become smaller, the frequency of the resonance point f1 becomes higher. Since the inductance L1 does not affect the resonance point f1 so much, the inductance L1 is not used for adjusting the resonance point f1.

Step 2: Based on the value of each component adjusted in step 1, the value of the component is adjusted so that the phase rotation amount θ of S11 at the second harmonic 7.0 GHz when the matching circuit 12 and the harmonic processing circuit 10 are viewed from the node N00 is close to the target. The goal is to set the phase rotation amount θ to in the range of ±4° of the target.

The target of the phase of S11 at the second harmonic 7.0 GHz is about 180°. As illustrated by the dotted line arrow in FIG. 10, the phase of the second harmonic 7.0 GHz is rotated by providing the harmonic processing circuit 10 from the phase of the second harmonic 7.0 GHz when the harmonic processing circuit 10 is not provided. The target of the phase rotation amount θ of S11 at the second harmonic 7.0 GHz by providing the harmonic processing circuit 10 differs depending on the matching circuit 12. For example, the target of the phase rotation amount θ is considered to be 0° to 360°. However, it is difficult to prepare the matching circuit 12 having a different phase of S11 at the second harmonic. Therefore, S11 of the matching circuit 12 was fixed to S11 (broken line) in which the harmonic processing circuit 10 of FIG. 10 was not provided in the simulation 3. It was decided to rotate the phase clockwise by the amount of rotation of the target from −37° at the second harmonic 7.0 GHz in FIG. 10. For example, when the phase rotation amount θ of the target is 90°, the goal is to set the target of the phase at the second harmonic 7.0 GHz to −107° as illustrated by the dotted line arrow in FIG. 10.

In step 2, increasing the inductance L1 increases the phase rotation amount θ, and decreasing the inductance L1 decreases the phase rotation amount θ. Changing the inductance L2, the capacitance C1 and the length D1 affects the resonance point f1 set in step 1. Therefore, the inductance L2, the capacitances C1 and the length D1 are not used in step 2.

Steps of the simulation will be described by taking the case where the phase rotation amount θ of the second harmonic of the target is 160° as an example.

Step S1: The inductances L1 and L2, the capacitance C1 and the length D1 of the transmission line 20 are fixed to the minimum values, and the length D2 of the transmission line 22 is adjusted to bring the resonance point f1 closer to the frequency 3.5 GHz of the fundamental wave. The result of adjusting the length D2 of the transmission line 22 is as follows.

L1: 0.5 nH (fixed)
L2: 6 nH (fixed)
C1: 0.2 pF (fixed)
C2: 7 pF (fixed)
D1: 1.4° (fixed)
D2: 8°

Figure 12A:
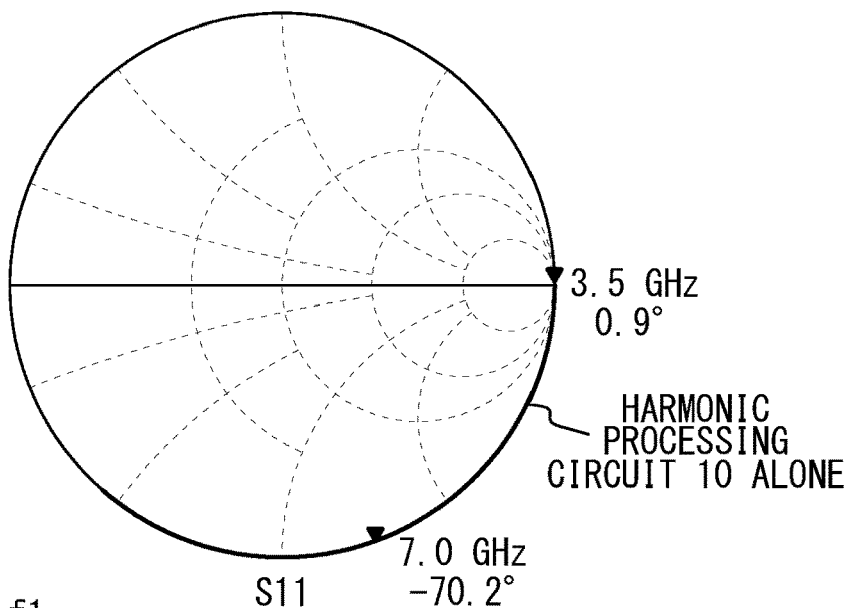
FIG. 12A to 12C are diagrams illustrating a simulation result of step S1 in a simulation 4.
Figure 12B:
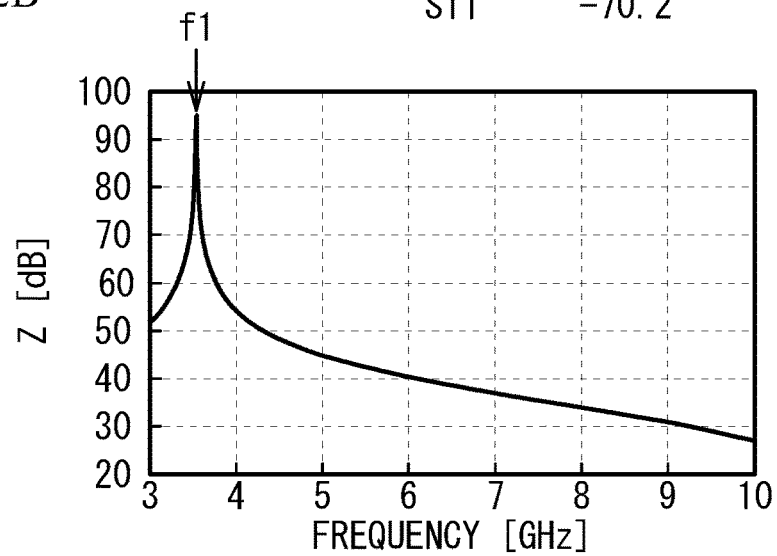
Figure 12C:
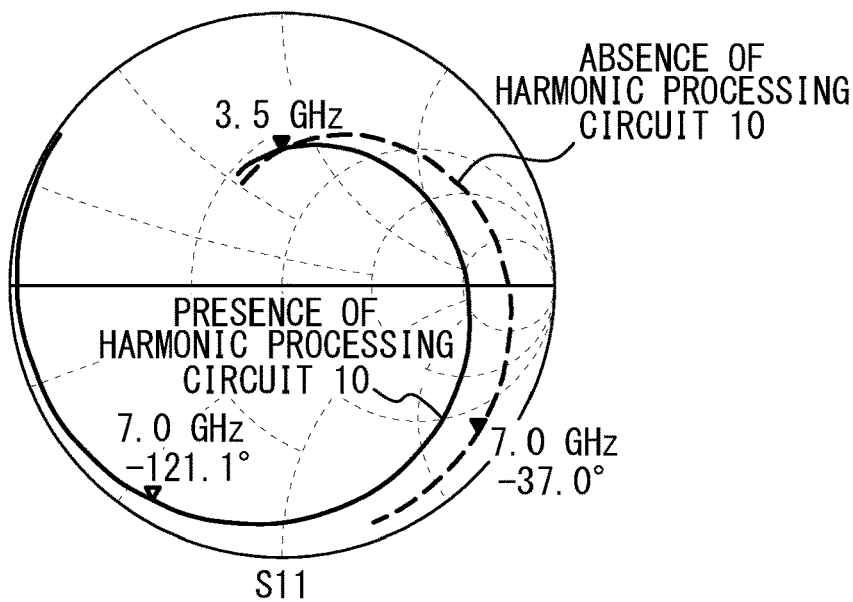

FIG. 12A to 12C are diagrams illustrating a simulation result of step S1 in the simulation 4. FIG. 12A is a diagram illustrating S11 of the harmonic processing circuit 10 alone as viewed from the node N0. FIG. 12B is a diagram illustrating the magnitude of the impedance with respect to the frequency in the harmonic processing circuit 10 alone. FIG. 12C is a diagram illustrating S11 of the matching circuit 12 as viewed from the node N00. As illustrated in FIG. 12A, the phase of S11 at 3.5 GHz is 0.90°, and the phase of S11 at 3.5 GHz is in the range of ±2° from the target 0° of step 1. The phase of S11 at the second harmonic 7.0 GHz is −70.2°. As illustrated in FIG. 12B, the resonance point f1 is approximately 3.5 GHz. The resonance point f2 is 10 GHz or more. As illustrated in FIG. 12C, since the harmonic processing circuit 10 is in the open state at the fundamental wave 3.5 GHz, S11 at the fundamental wave 3.5 GHz is substantially the same regardless of the presence or absence of the harmonic processing circuit 10. The phase of S11 at the second harmonic 7.0 GHz is −37.0° in the presence of the harmonic processing circuit 10, and −121.1° in the absence of the harmonic processing circuit 10. The phase rotation amount θ is about 84.1°, which is significantly different from the target 160°.

Step S2: By fixing the values of the components other than the inductance L1 and increasing the inductance L1, the phase of the second harmonic is rotated clockwise and the phase rotation amount θ is brought closer to the target (160°). Each value as a result of adjusting the inductor L1 is as follows.

L1: 3 nH
L2: 6 nH (fixed)
C1: 0.2 pF (fixed)
C2: 7 pF (fixed)
D1: 1.4° (fixed)
D2: 8° (fixed)

Figure 13A:
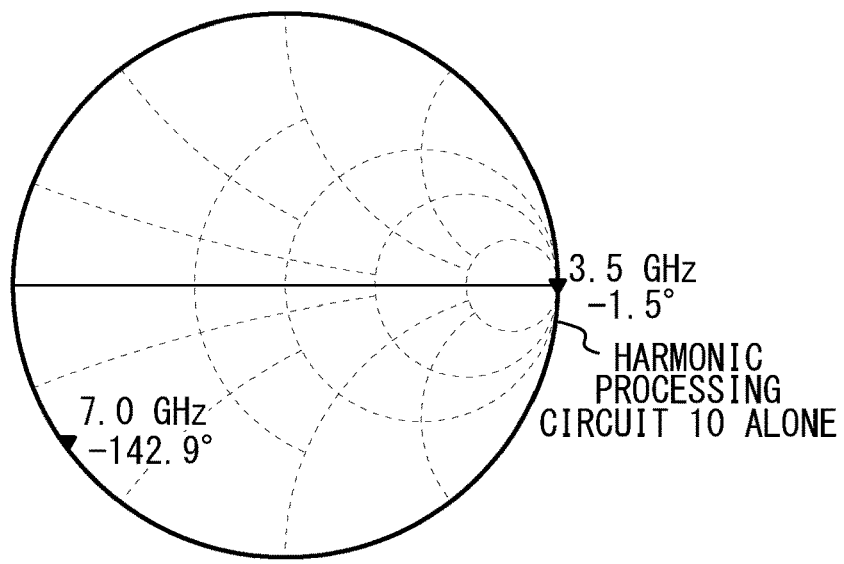
FIG. 13A to 13C are diagrams illustrating a simulation result of step S2 in the simulation 4.
Figure 13B:
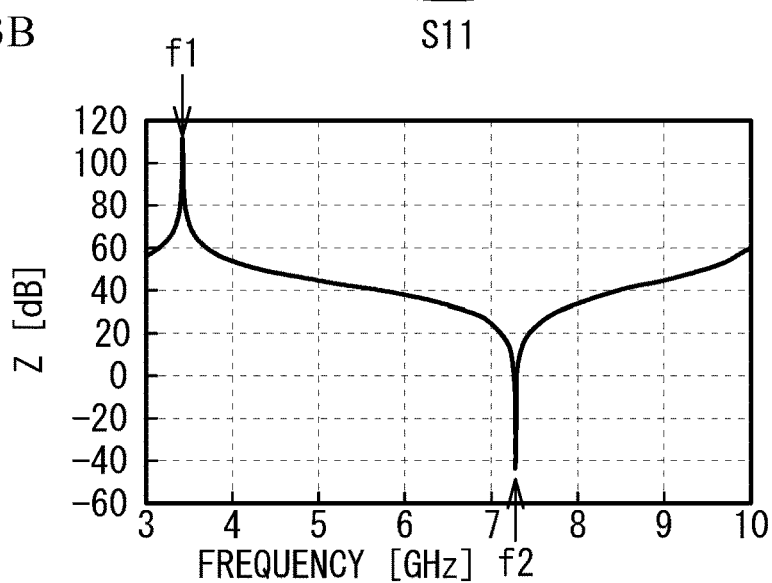
Figure 13C:
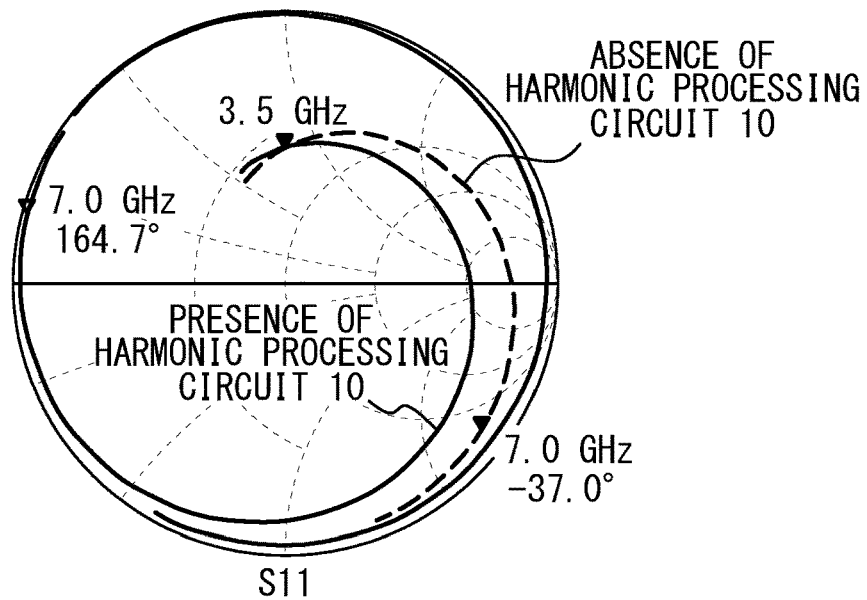

FIG. 13A to 13C are diagrams illustrating a simulation result of step S2 in the simulation 4. As illustrated in FIG. 13A, the phase of S11 at 3.5 GHz is −1.5°, and the phase of S11 at 3.5 GHz is in the range of ±2° from the target 0° of step 1. The phase of S11 at the second harmonic 7.0 GHz is −142.9°. As illustrated in FIG. 13B, the resonance point f1 is approximately 3.5 GHz. The resonance point f2 is 7.3 GHz. As illustrated in FIG. 13C, the phase of S11 at the second harmonic 7.0 GHz is −37.0° in the absence of the harmonic processing circuit 10, and 164.7° (−195.3°) in the presence of the harmonic processing circuit 10. The phase rotation amount θ is 158.3°, which can be set to in the range of ±4° from the target 160° of step 2. Thus, when the length D2 of the transmission line 22 is 8°, even if the phase rotation amount θ is set to 160° as the target as illustrated in FIG. 13C, the phase of S11 in the fundamental wave of the harmonic processing circuit 10 alone is located in the range of 0°±2° as illustrated in FIG. 13A. In this way, the resonance points f1 and f2 can be adjusted to the fundamental wave and the second harmonic.

Step S3: The length D2 of the transmission line 22 is set to 8.5° which is 0.5° longer than step S2, the values of the components other than the inductance L1 are fixed, and the inductance L1 is increased, which brings the phase rotation amount closer to the target (160°). Each value as a result of adjusting the inductor L1 is as follows.

L1: 3 nH
L2: 6 nH (fixed)
C1: 0.2 pF (fixed)
C2: 7 pF (fixed)
D1: 1.4° (fixed)
D2: 8.5° (fixed)

Figure 14A:
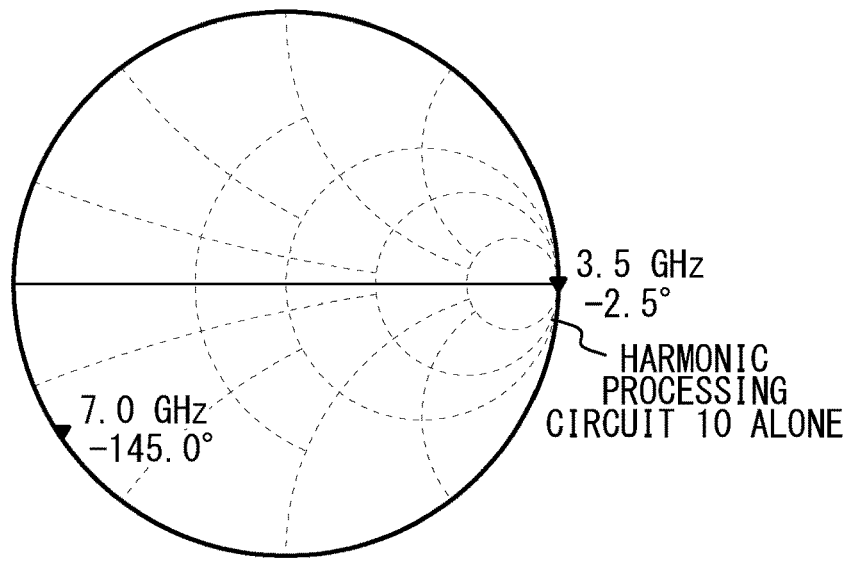
FIG. 14A to 14C are diagrams illustrating a simulation result of step S3 in the simulation 4.
Figure 14B:
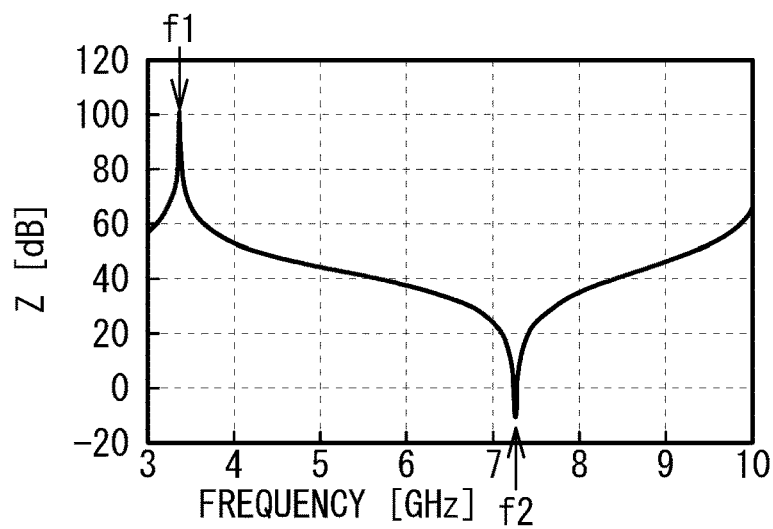
Figure 14C:
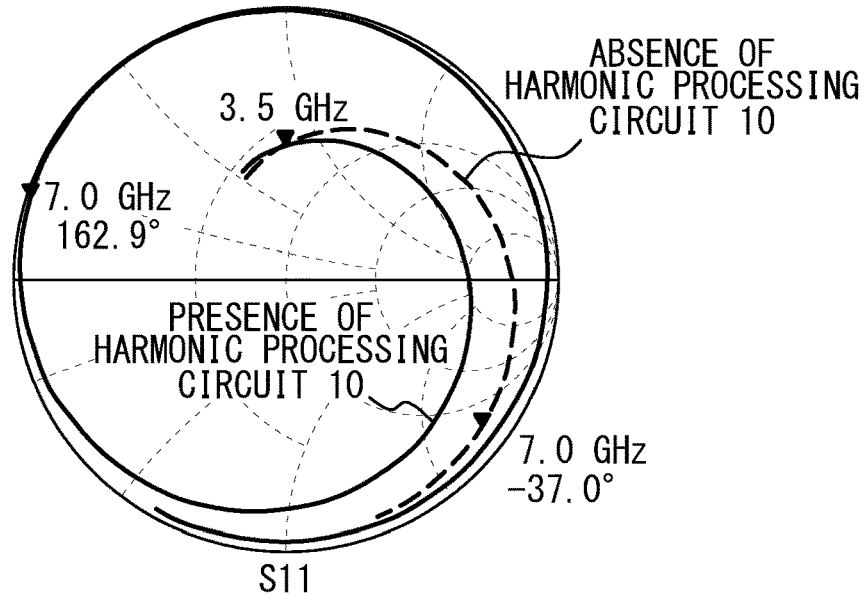

FIG. 14A to 14C are diagrams illustrating a simulation result of step S3 in the simulation 4. As illustrated in FIG. 14A, the phase of S11 at 3.5 GHz is −2.5°, and the phase of S11 at 3.5 GHz deviates from the range of ±2° from the target 0° of step 1. The phase of S11 at the second harmonic 7.0 GHz is −145.0°. As illustrated in FIG. 14B, the resonance point f1 is approximately 3.5 GHz. The resonance point f2 is 7.3 GHz. As illustrated in FIG. 14C, the phase of S11 at the second harmonic 7.0 GHz is −37.0° in the absence of the harmonic processing circuit 10 and 162.9° (−197.1°) in the presence of the harmonic processing circuit 10. The phase rotation amount θ is 160.1°, which can be set to the range of ±4° from the target 160° of step 2. Thus, when the length D2 of the transmission line 22 is 8.5° and the phase rotation amount θ is 160° as the target as illustrated in FIG. 14A, the phase of S11 at the fundamental wave of the harmonic processing circuit 10 alone deviates from the range of 0°±2° as illustrated in FIG. 14C.

This is due to the following reasons. When the resonance point f1 is brought closer to the frequency of the fundamental wave, the inductance L1 will be reduced, but the inductance L1 cannot be reduced because the inductance L1 is used for adjusting the resonance point f2 (rotation of the phase at the second harmonic). Since the inductance L2, the capacitance C1 and the length D1 are the minimum values, they cannot be reduced. In this way, when the length D2 of the transmission line 22 is set to 8.5°, the resonance point f1 and the resonance point f2 cannot be adjusted.

In steps S1 to S3, the inductance L2, the capacitance C1 and the length D2 are set to the minimum values. When these values are made larger than the minimum value, the resonance point f1 becomes lower. Therefore, in order to set the resonance point f1 as the frequency of the fundamental wave, the length D2 of the transmission line 22 must be shorter than 8°. For example, consider a case where the length D1 of the transmission line 20 is changed from 1.4° to 2.4° on the premise of the value of each component as the result of the adjustment in step S2. In this case, in order for the phase rotation amount θ to be 160° as the target, the inductance L1 should be changed from 3° to 2.6°, and the length D2 of the transmission line 22 should be changed from 8° to 7.5°. In this way, the length D2 of the transmission line 22 is shorter than 8°.

As described above, when the inductance L2, the capacitance C1 and the length D2 are made larger than the minimum values, the length D2 of the transmission line 22 becomes shorter than 8°. In this way, if the length D2 of the transmission line 22 is longer than 8°, the resonance points f1 and f2 cannot be adjusted to the fundamental wave and the second harmonic. Therefore, the maximum value of the length D2 of the transmission line 22 whose resonance points f1 and f2 can be adjusted to the fundamental wave and the second harmonic is 8°.

The phase rotation amount θ of the target was changed, and the length D2 of the transmission line 22 in which the resonance points f1 and f2 can be adjusted was simulated in the same manner as in steps S1 to S3. FIG. 15 is a diagram illustrating a range of the length D2 in which the resonance points f1 and f2 can be adjusted, with respect to the phase rotation amount θ of the target in the simulation 4. The length D2 of the transmission line 22 corresponds to the range of the length D2 where the resonance points f1 and f2 can be adjusted. The inductances L1 and L2, the capacitance C1 and the length D1 of the transmission line 20 are values after the resonance points f1 and f2 are adjusted at the upper limit where the length D2 can be adjusted. Hatching represents that it is not adjustable.

As illustrated in FIG. 15, when the phase rotation amount θ of the target is 10° and 40°, there is no range of the length D2 in which the resonance points f1 and f2 can be adjusted. When the phase rotation amount θ of the target is 70° to 340°, there are ranges of the length D2 in which the resonance points f1 and f2 can be adjusted. When the phase rotation amount θ of the target is 70°, the length D2 is 5° or less. When the phase rotation amount θ of the target is 100° to 340°, the upper limit of the length D2 in which the resonance points f1 and f2 can be adjusted is 7° to 9°.

As illustrated in the simulation 4, the length D2 of the transmission line 22 corresponds to 0° or more and 9° or less of the phase of the fundamental wave, and the length D1 of the transmission line 20 corresponds to 0° or more and 45° or less of the phase of the fundamental wave. This makes it possible to adjust the resonance points f1 and f2 to the fundamental wave and the second harmonic, respectively. The length D2 of the transmission line 22 is preferably 8° or less, more preferably 7° or less, still more preferably 5° or less. From the viewpoint of small in size, the length D1 of the transmission line 20 is preferably 35° or less, more preferably 25° or less.

Second Embodiment

Figure 16:
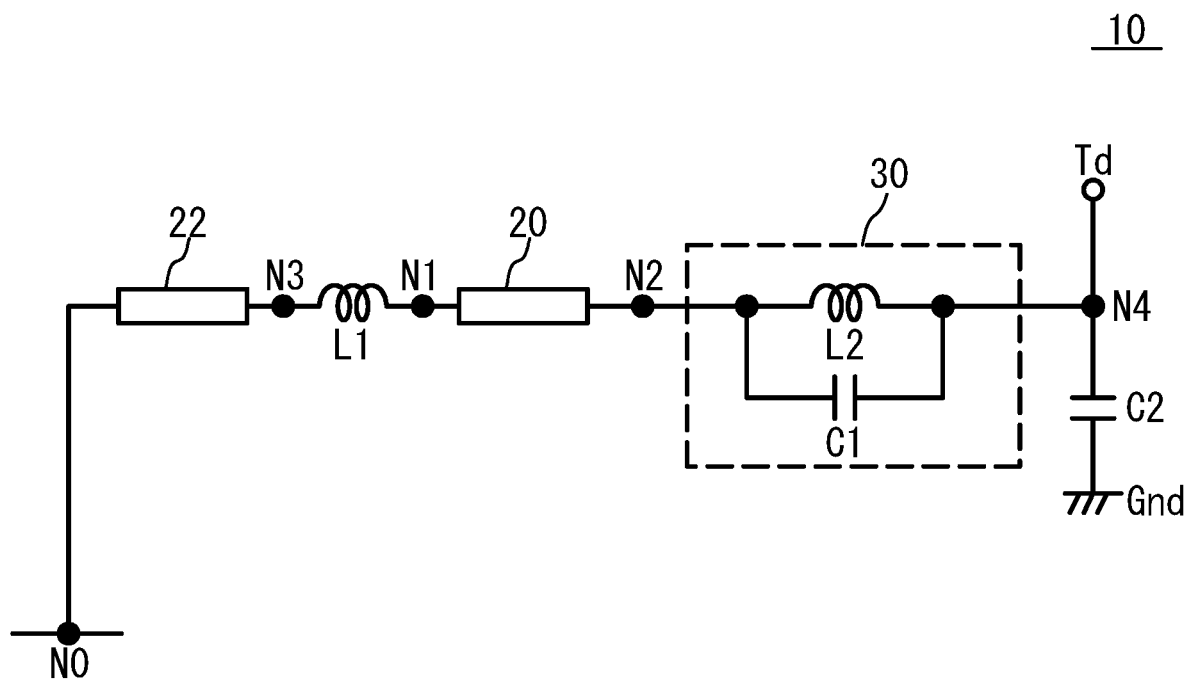
FIG. 16 is a circuit diagram illustrating an amplification device according to a second embodiment.

The second embodiment is an example in which the chip inductor is used as the inductor L2 and the parasitic capacitance component of the chip inductor is used as the capacitor C1. FIG. 16 is a circuit diagram illustrating an amplification device according to a second embodiment. As illustrated in FIG. 16, a chip inductor 30 is used as the inductor L2. The capacitor C1 is a parasitic capacitance component of the chip inductor 30. The chip inductor 30 becomes the parallel resonant circuit 24. One end of the chip inductor 30 is connected to the node N2, and the other end of the chip inductor 30 is connected to the node N4. The bias terminal Td is connected to the node N4. One end of the capacitor C2 is connected to the node N4 and the other end of the capacitor C2 is connected to the ground Gnd. Other configurations are the same as those in the first embodiment.

By using the parasitic capacitance component of the chip inductor 30 as the capacitor C1, the capacitance C1 can be reduced. If the external dimensions of the chip inductor 30 are unchanged, the parasitic capacitance component is substantially unchanged. Therefore, even if the inductance L2 of the chip inductor 30 is changed, the capacitance C1 is substantially fixed. The typical parasitic capacitance component of the chip inductor is 0.05 pF to 0.1 pF.

Simulation 5

With respect to the second comparative example in which the transmission lines 20 and 22 are not provided and the second embodiment in which the transmission lines 20 and 22 are provided, assuming that the values such as the inductance of the component were discrete as in the simulation 3, the conditions where the phase of the second harmonic was closest to 176.5° were simulated using the optimization function of the simulator.

The simulation conditions are as follows.
Frequency of fundamental wave: 3.5 GHz
Frequency of second harmonic: 7.0 GHz
Harmonic processing circuit 10
L1: 0.6 nH to 6 nH, in increments of 0.1 nH
L2: 6 nH to 10 nH, in increments of 0.5 nH
C1: 0.07 pF (fixed)
C2: 7 pF (fixed)
Characteristic impedance of transmission lines 20 and 22: 50Ω
Matching circuit 12: same as matching circuit 12 in the simulation 3
The capacitance C1 is the typical parasitic capacitance component of the chip inductor 30.
Each of optimized number is as follows.
Second comparative example
L1: 4.9 nH
L2: 9.5 nH
C1: 0.07 pF (fixed)
C2: 7 pF (fixed)
Second embodiment
L1: 2.6 nH
L2: 9.5 nH
C1: 0.07 pF (fixed)
C2: 7 pF (fixed)
D1: 9°
D2: 0°

Figure 17A:
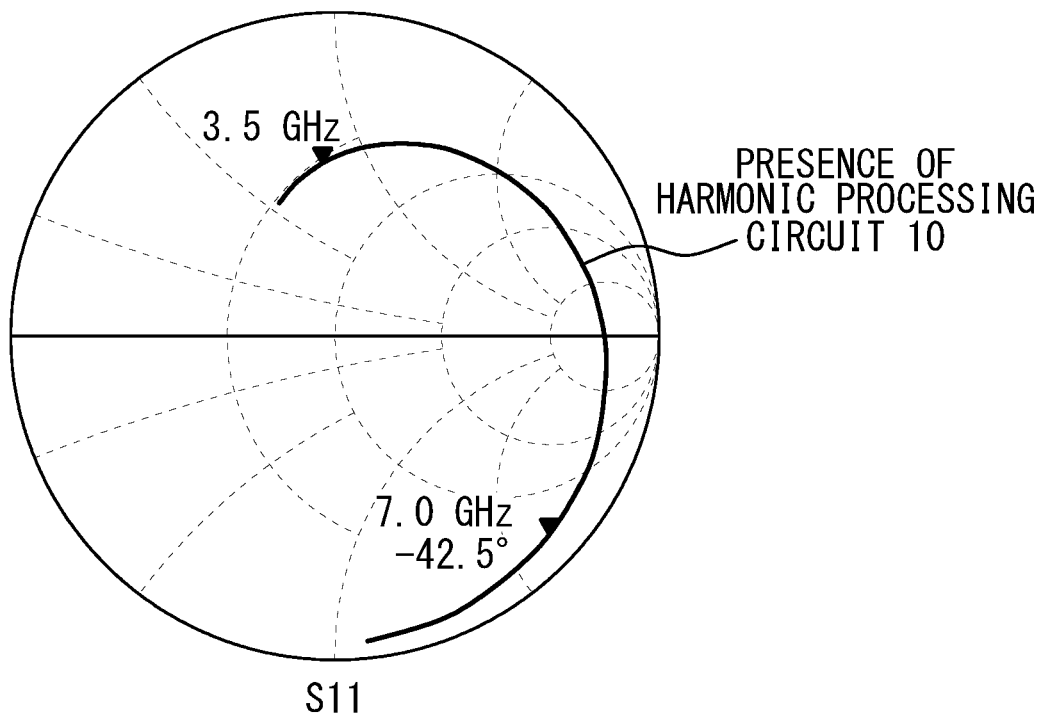
FIG. 17A is a Smith chart of S11 when the matching circuit is viewed from an output node of the amplifier according to a second comparative example optimized in a simulation 5.
Figure 17B:
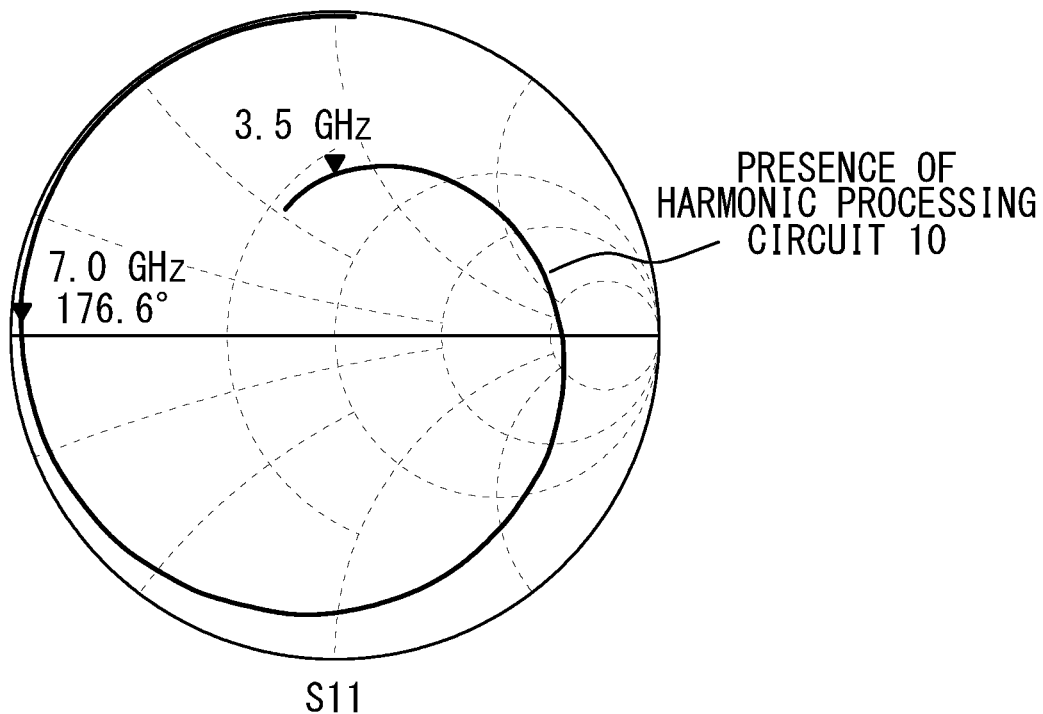
FIG. 17B is a Smith chart of S11 when the matching circuit is viewed from an output node of the amplifier according to the second embodiment optimized in the simulation 5.

FIGS. 17A and 17B are Smith charts of S11 when the matching circuit 12 is viewed from the output node N00 of the amplifier according to the second comparative example and the second embodiment optimized in the simulation 5, respectively. FIGS. 17A and 17B illustrate S11 when the harmonic processing circuit 10 is provided. FIG. 17A corresponds to the second comparative example and FIG. 17B corresponds to the second embodiment. As illustrated in FIG. 17A, in the second comparative example, the phase at the second harmonic 7.0 GHz is about −42.5° even if it is optimized. The efficiency of the amplification device 100 is 61.7%. In the second embodiment, the phase at the second harmonic 7.0 GHz is 176.6°. The efficiency of the amplification device 100 is 65.6%. Thus, in the second embodiment, the phase of S11 at the second harmonic can be set as a substantially target value, and the efficiency can be made higher than that of the second comparative example.

According to the second embodiment, the inductor L2 is the chip inductor 30, and the capacitor C1 is the parasitic capacitance component of the chip inductor 30. This can reduce the number of components. However, since the capacitance C1 has a fixed value, it becomes difficult to adjust the resonance points f1 and f2 to the fundamental wave and the second harmonic. Therefore, the transmission lines 20 and 22 are provided as in the second embodiment. This makes it possible to adjust the resonance points f1 and f2 to the fundamental wave and the second harmonic.

Simulation 6

It was found that, when the capacitor C1 is fixed to a small value as in the second embodiment, the resonance points f1 and f2 could not be adjusted to the fundamental wave and the second harmonic unless the length D1 of the transmission line 20 was set to a predetermined value or more without depending on the phase rotation amount θ of S11 at the second harmonic 7.0 GHz. Simulation 6 representing this was performed. In the simulation 6, the simulation was performed manually without using the optimization function of the simulator.

The adjustment range of each value of each component is as follows.
L1: 0.5 nH to 6 nH, in increments of 0.1 nH
L2: 6 nH to 10 nH, in increments of 0.5 nH
C1: 0.07 pF
C2: 7 pF
D1: in increments of 0.1°
D2: in increments of 0.1°
Characteristic impedance of transmission lines 20 and 22: 50Ω
Matching circuit 12: same as matching circuit 12 in the simulation 3

Steps of the simulation will be described by taking the case where the phase rotation amount θ of the second harmonic of the target is 160° as an example.

Step S4: The inductances L1 and L2 and the length D1 of the transmission line 20 are fixed to the minimum values, and the length D2 of the transmission line 22 is set to 8°. A reason why the length D2 is set to 8° is to match the maximum value of the length D2 of FIG. 15 in the simulation 4.
L1: 0.5 nH (fixed)
L2: 6 nH (fixed)
C1: 0.07 pF (fixed)
C2: 7 pF (fixed)
D1: 1.4° (fixed)
D2: 8° (fixed)

Figure 18A:
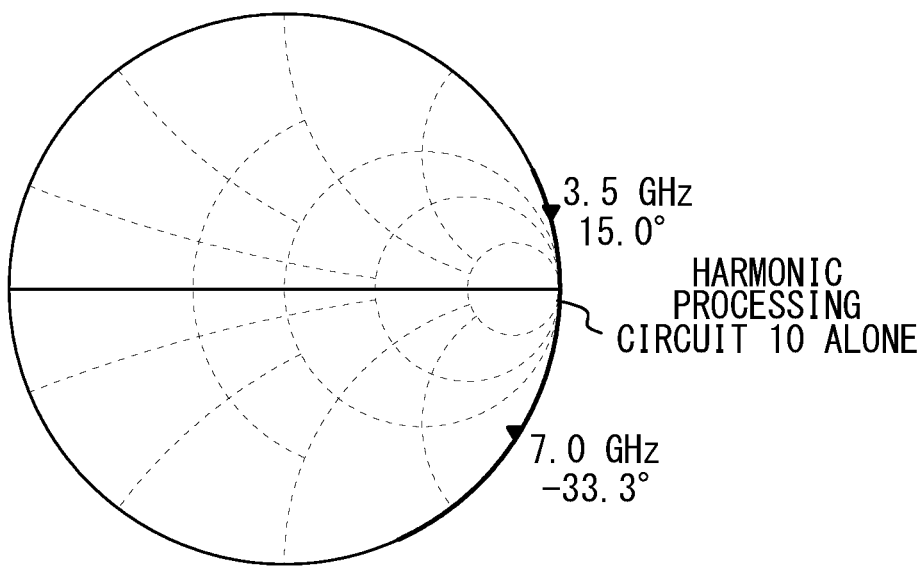
FIGS. 18A to 18C are diagrams illustrating a simulation result of step S4 in a simulation 6.
Figure 18B:
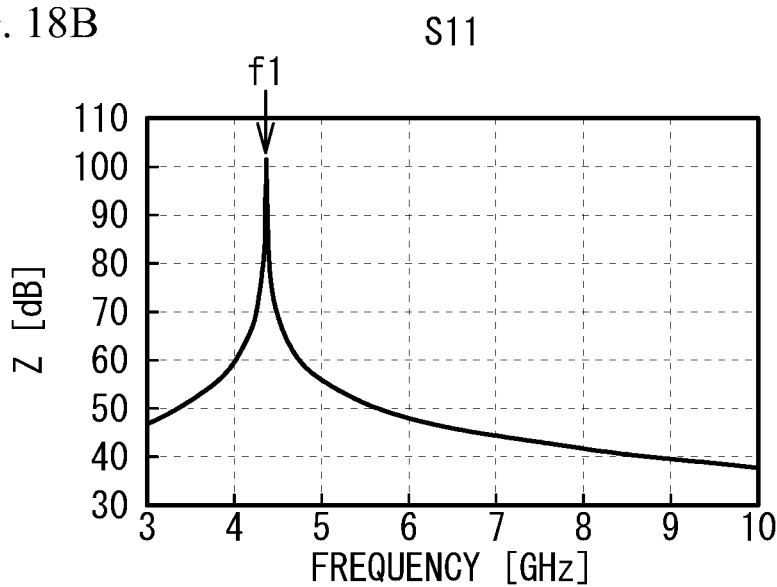
Figure 18C:
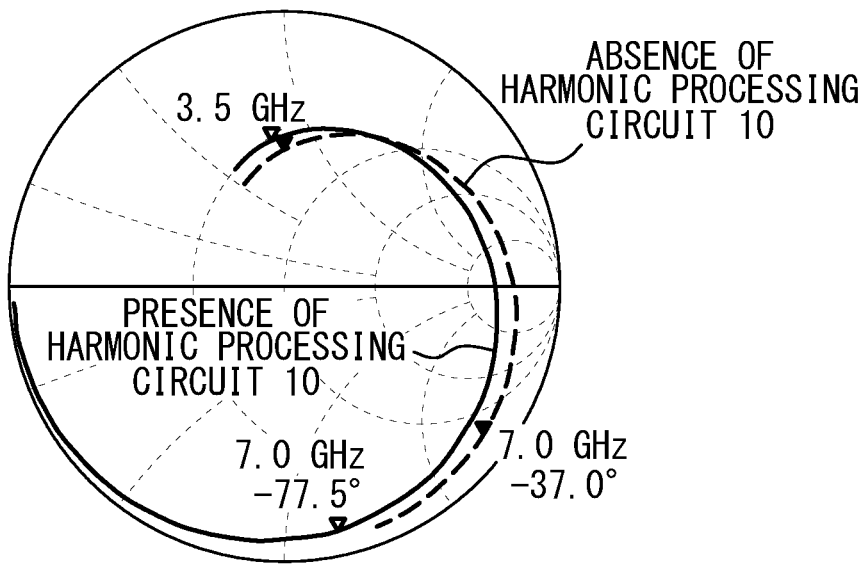

FIGS. 18A to 18C are diagrams illustrating a simulation result of step S4 in the simulation 6. FIG. 18A is a diagram illustrating S11 of the harmonic processing circuit 10 alone as viewed from the node N0. FIG. 18B is a diagram illustrating the magnitude of impedance with respect to frequency in the harmonic processing circuit 10 alone. FIG. 18C is a diagram illustrating S11 of the matching circuit 12 as viewed from the node N00. As illustrated in FIG. 18A, the phase of S11 at the fundamental wave 3.5 GHz is 15.0°, and the phase of S11 at the second harmonic 7.0 GHz is −33.3°. As illustrated in FIG. 18B, the resonance point f1 is higher than the fundamental wave 3.5 GHz and is 4.4 GHz. The resonance point f2 is 10 GHz or more. Since the resonance point f1 deviates from the fundamental wave, S11 at the fundamental wave 3.5 GHz differs depending on the absence and the presence of the harmonic processing circuit 10, as illustrated in FIG. 18C. The phase of S11 at the second harmonic 7.0 GHz is −37.0° and −77.5° in the absence and the presence of the harmonic processing circuit 10, respectively.

In step S4, the resonance point f1 is higher than the fundamental wave 3.5 GHz. In order to lower the resonance point f1, the following steps S5 to S7 were performed to increase the length D2 of the transmission line 22, the inductance L2, and the length D1 of the transmission line 20. In steps S5 to S7, the resonance point f1 is adjusted without using the inductance L1 as in step 1 of the simulation 4. Then, the resonance point f2 is adjusted using the inductance L1 as in step 2.

Step S5: The length D2 of the transmission line 22 is lengthened, the values of other components are fixed to the values of step S4, and the resonance point f1 is adjusted to the fundamental wave 3.5 GHz. After that, the values of respective components other than the inductance L1 are fixed, and the resonance point f2 is adjusted using the inductance L1. Each value of the adjustment result of step S5 is as follows.

L1: 6 nH
L2: 6 nH (fixed)
C1: 0.07 pF (fixed)
C2: 7 pF (fixed)
D1: 1.4° (fixed)
D2: 9.5°

Figure 19A:
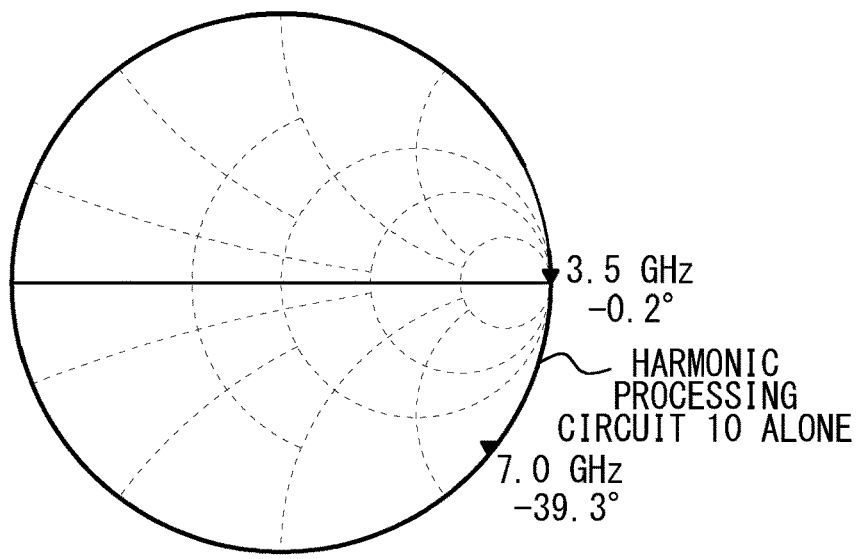
FIGS. 19A to 19C are diagrams illustrating a simulation result of step S5 in the simulation 6.
Figure 19B:
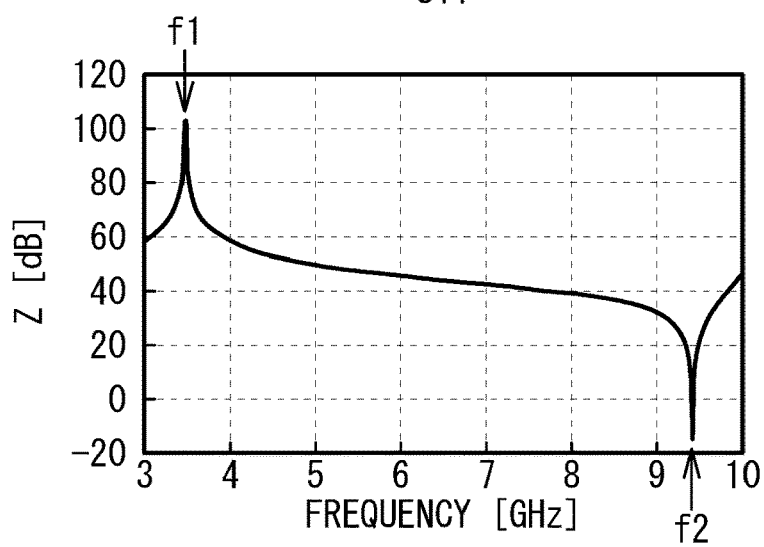
Figure 19C:
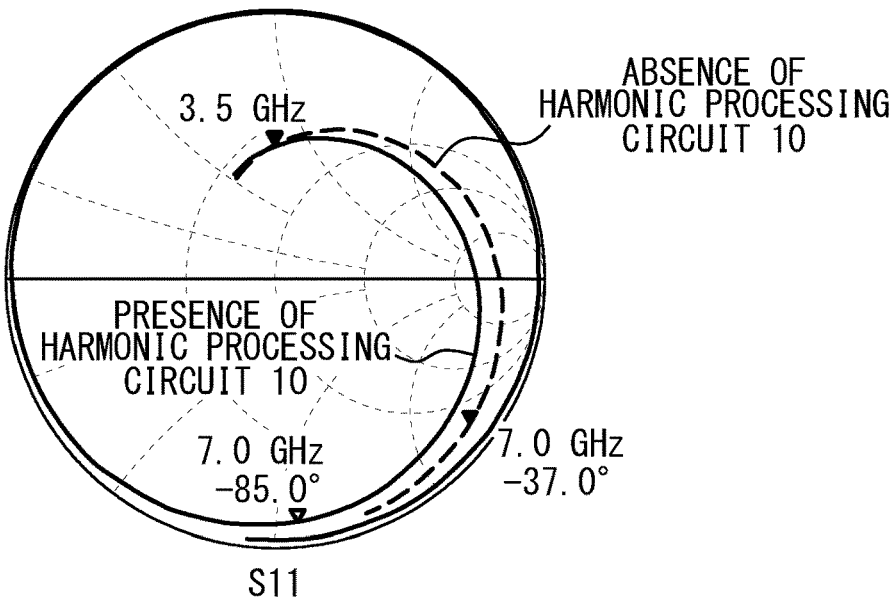

FIGS. 19A to 19C are diagrams illustrating a simulation result of step S5 in the simulation 6. As illustrated in FIG. 19A, the phase of S11 at 3.5 GHz is −0.2°, and the phase of S11 at 3.5 GHz is in the range of ±2° from the target 0°. The phase of S11 at the second harmonic 7.0 GHz is −39.3°. As illustrated in FIG. 19B, the resonance point f1 is approximately 3.5 GHz. The resonance point f2 is 9.4 GHz. As illustrated in FIG. 19C, the phases of S11 at the second harmonic of 7.0 GHz are −37.0° and −85.0° in the absence and the presence of the harmonic processing circuit 10, respectively. The phase rotation amount θ is 48.0°, which is smaller than 160° of the target. Thus, the resonance point f1 can be adjusted by lengthening the length D2 of the transmission line 22. However, even if the inductance L1 is increased, the resonance point f2 cannot be adjusted, and the phase rotation amount θ becomes smaller than 160° of the target.

Step S6: The inductance L2 is increased, the values of other components are fixed to the values of step S4, and the resonance point f1 is adjusted to the fundamental wave 3.5 GHz. After that, the values of respective components other than the inductance L1 are fixed, and the resonance point f2 is adjusted using the inductance L1. Each value of the adjustment result of step S6 is as follows.

L1: 6 nH
L2: 7.5 nH
C1: 0.07 pF (fixed)
C2: 7 pF (fixed)
D1: 1.4° (fixed)
D2: 8° (fixed)

Figure 20A:
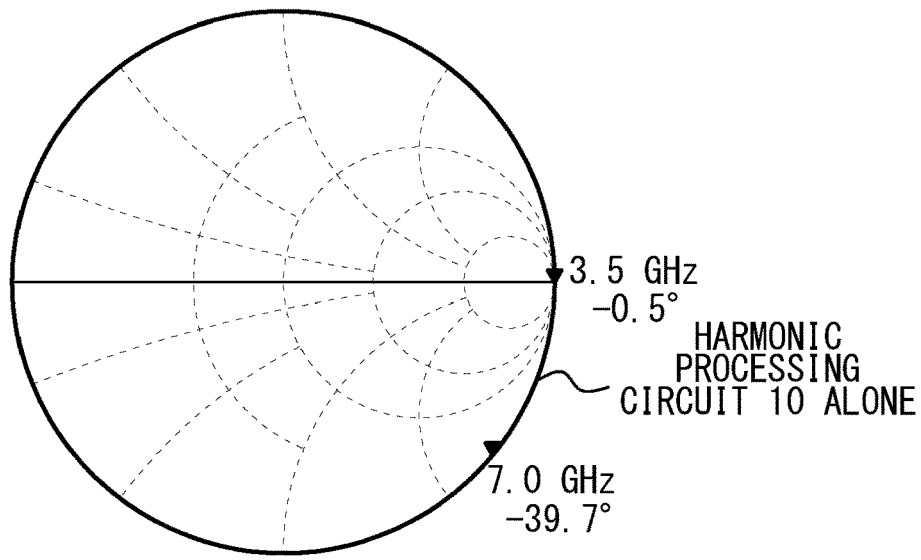
FIGS. 20A to 20C are diagrams illustrating a simulation result of step S6 in the simulation 6.
Figure 20B:
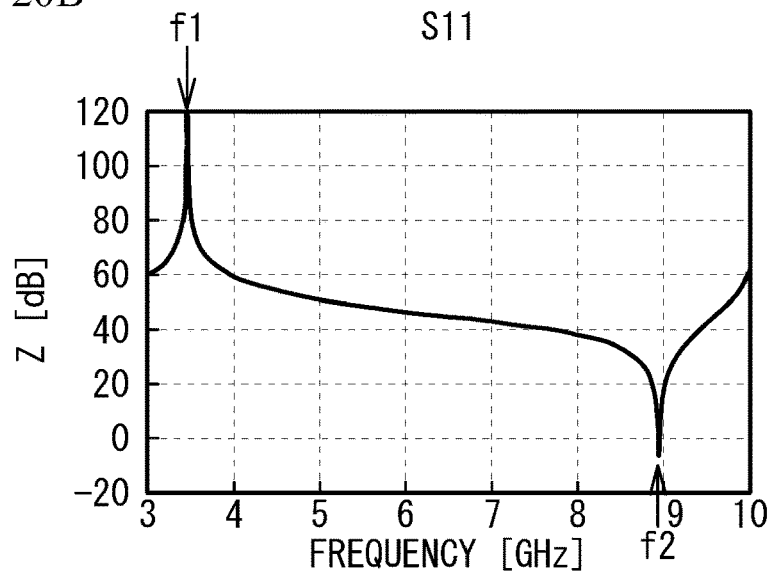
Figure 20C:
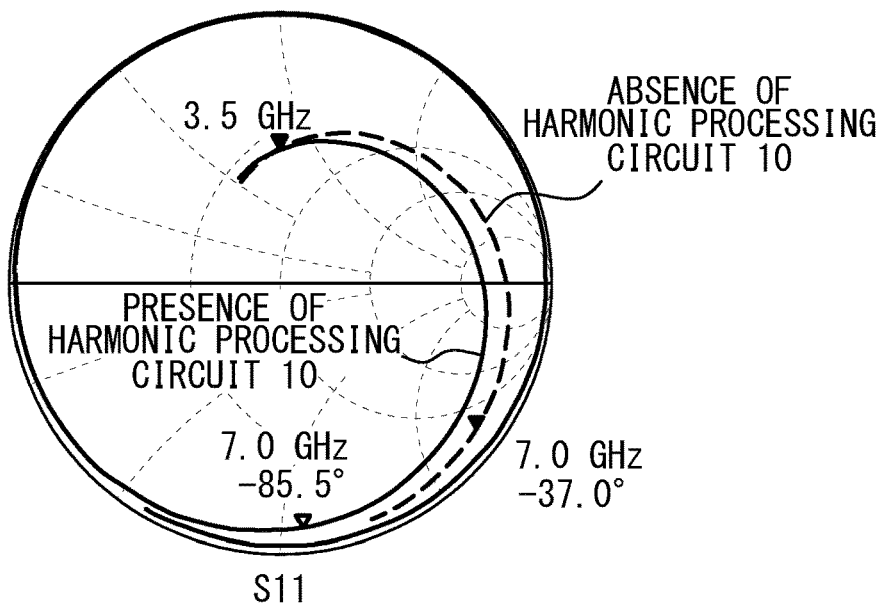

FIGS. 20A to 20C are diagrams illustrating a simulation result of step S6 in the simulation 6. As illustrated in FIG. 20A, the phase of S1 at 3.5 GHz S11 is −0.5°, and the phase of S11 at 3.5 GHz is in the range of ±2° from the target 0°. The phase of S11 at the second harmonic 7.0 GHz is −39.7°. As illustrated in FIG. 20B, the resonance point f1 is approximately 3.5 GHz. The resonance point f2 is 9.0 GHz. As illustrated in FIG. 20C, the phases of S11 at the second harmonic 7.0 GHz are −37.0° and −85.5° in the absence and the presence of the harmonic processing circuit 10, respectively. The phase rotation amount θ is 48.5°, which is smaller than 160° of the target. Thus, the resonance point f1 can be adjusted by increasing the inductance L1. However, even if the inductance L1 is increased, the resonance point f2 cannot be adjusted, and the phase rotation amount θ becomes smaller than 160° of the target.

Step S7: The length D of the transmission line 20 is lengthened, the values of other components are fixed to the values of step S4, and the resonance point f1 is adjusted to the fundamental wave 3.5 GHz. After that, the values of respective components other than the inductance L1 are fixed, and the resonance point f2 is adjusted using the inductance L1. Each value of the adjustment result of step S7 is as follows.

L1: 3 nH
L2: 6 nH (fixed)
C1: 0.07 pF (fixed)
C2: 7 pF (fixed)
D1: 9.4°
D2: 8° (fixed)

Figure 21A:
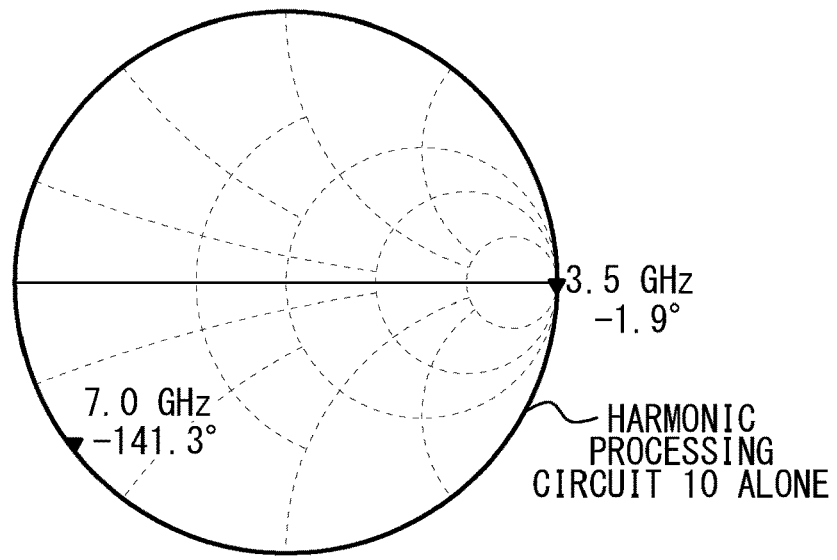
FIGS. 21A to 21C are diagrams illustrating a simulation result of step S7 in the simulation 6.
Figure 21B:
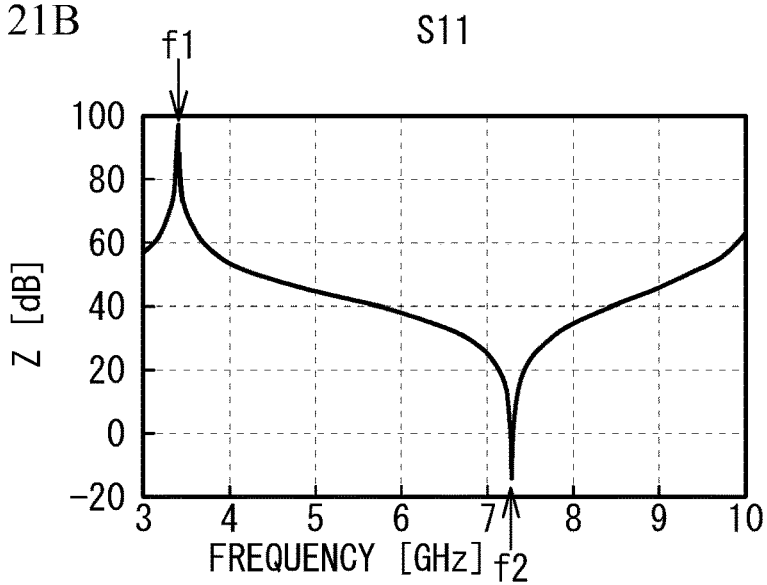
Figure 21C:
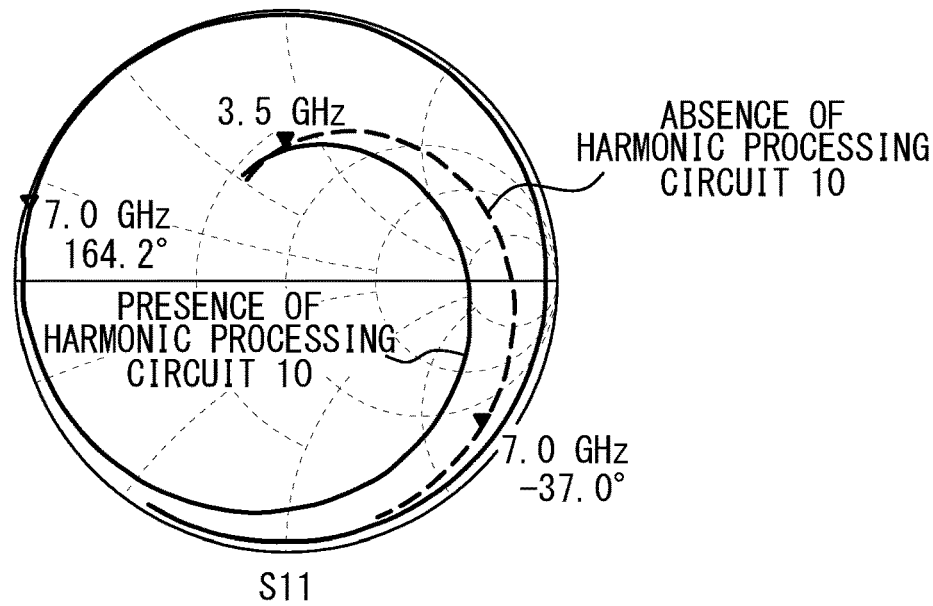

FIGS. 21A to 21C are diagrams illustrating a simulation result of step S7 in the simulation 6. As illustrated in FIG. 21A, the phase of S1 at 3.5 GHz S11 is −1.9°, and the phase of S11 at 3.5 GHz is in the range of ±2° from the target 0°. The phase of S11 at the second harmonic 7.0 GHz is −141.3°. As illustrated in FIG. 21B, the resonance point f1 is approximately 3.5 GHz. The resonance point f2 is 7.3 GHz. As illustrated in FIG. 21C, the phases of S11 at the second harmonic 7.0 GHz are −37.0° and 164.2° (−195.8°) in the absence and the presence of the harmonic processing circuit 10, respectively. The phase rotation amount θ is 158.8°, which is in the range of ±4° from the target 160°.

As illustrated in steps S5 to S7, in order to rotate the phase of S11 at the second harmonic by 160° by setting the length D2 of the transmission line 22 to 8°, adjusting the resonance point f1 to the fundamental wave 3.5 GHz, and providing the harmonic processing circuit 10, the length D1 of the transmission line 20 must be lengthened. When the length D2 of the transmission line 22 was 8°, the lower limit of the length D1 of the transmission line 20 capable of adjusting the phase rotation amount θ of S11 at the second harmonic to the target (160°) was investigated.

Step S8: The length D2 of the transmission line 22 is fixed at 8°, and the inductance L2 and the length D1 of the transmission line 20 are changed to adjust the resonance point f1 to the fundamental wave 3.5 GHz. After that, the resonance point f2 is adjusted using the inductance L1. A minimum value of the length D1 in which the phase rotation amount θ can be set to the target 160° is determined. Each value of the adjustment result of step S8 is as follows.

L1: 6 nH
L2: 6.5 nH
C1: 0.07 pF (fixed)
C2: 7 pF (fixed)
D1: 5.4°
D2: 8° (fixed)

Figure 22A:
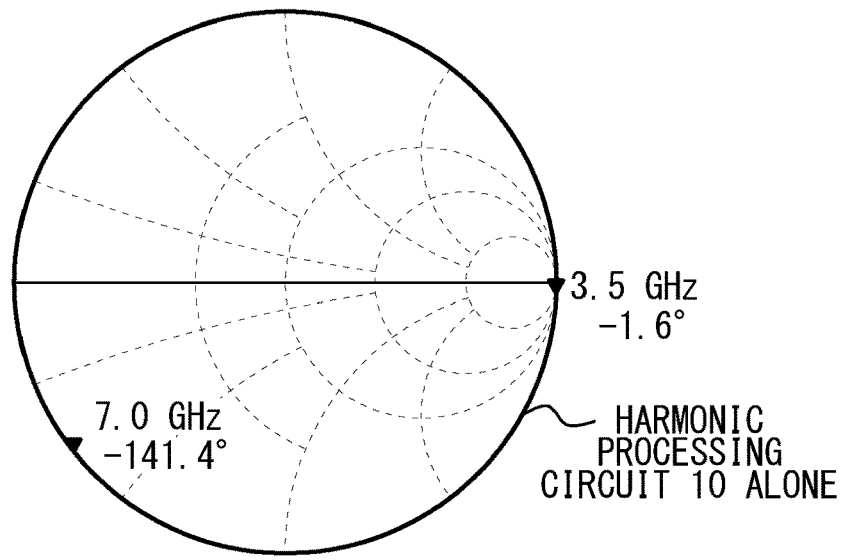
FIGS. 22A to 22C are diagrams illustrating a simulation result of step S8 in the simulation 6.
Figure 22B:
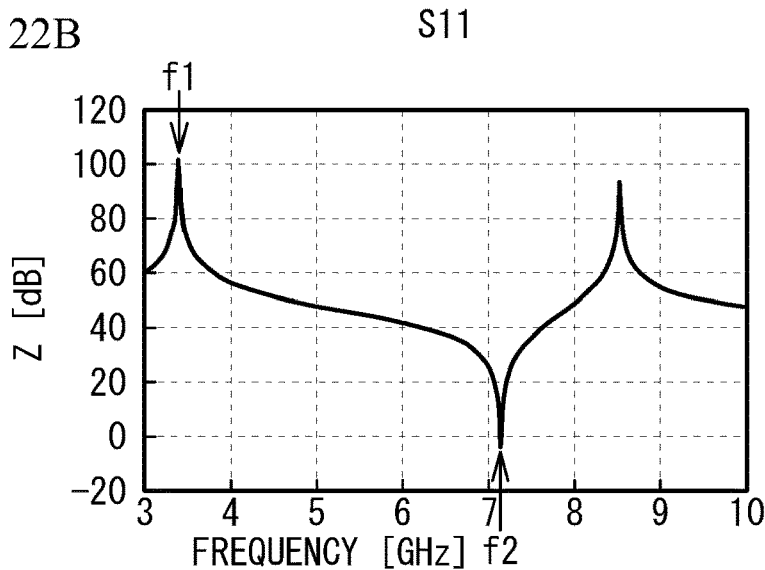
Figure 22C:
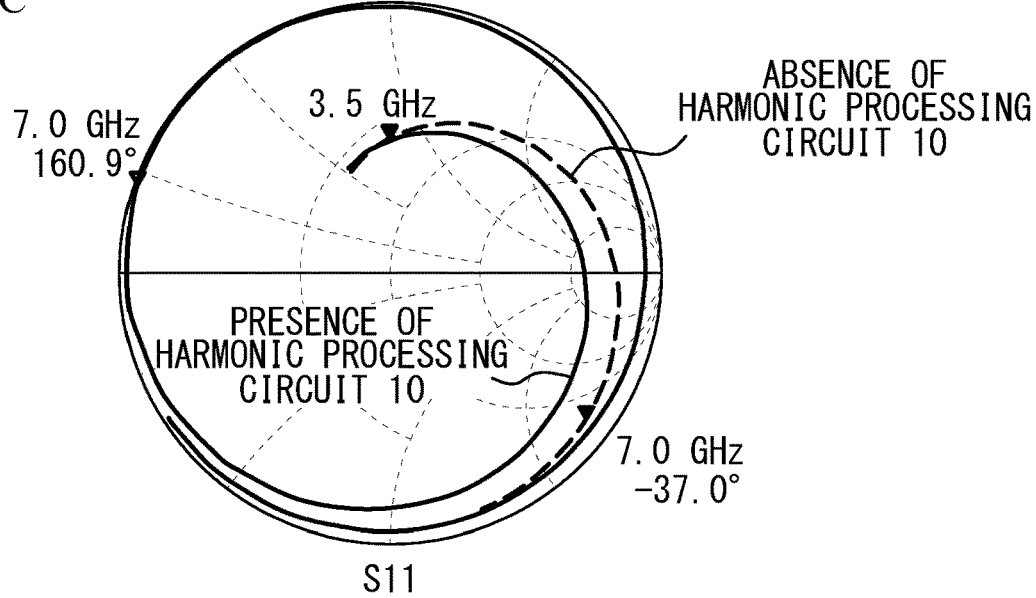

FIGS. 22A to 22C are diagrams illustrating a simulation result of step S8 in the simulation 6. As illustrated in FIG. 22A, the phase of S1 at 3.5 GHz is −1.6°, and the phase of S11 at 3.5 GHz is in the range of ±2° from the target 0°. The phase of S11 at the second harmonic 7.0 GHz is −141.4°. As illustrated in FIG. 22B, the resonance point f1 is approximately 3.5 GHz. The resonance point f2 is 7.1 GHz. As illustrated in FIG. 22C, the phases of S11 at the second harmonic 7.0 GHz are −37.0° and 160.9° (−199.1°) in the absence and the presence of the harmonic processing circuit 10, respectively. The phase rotation amount θ is 162.1°, which is in the range of ±4° from the target 160°.

The phase rotation amount θ of the second harmonic of the target was changed, and the length D1 of the transmission line 20 in which the resonance points f1 and f2 can be adjusted was simulated when the length D2 of the transmission line 22 was 8° in the same manner as step S8. FIGS. 23A and 23B are diagrams illustrating a range of the length D1 in which the resonance points f1 and f2 can be adjusted, with respect to the phase rotation amount θ of the target in the simulation 6. The hatching represents that it is not adjustable. FIG. 23A illustrates a case where the length D2 of the transmission line 22 is set to 8°.

As illustrated in FIG. 23A, when the phase rotation amount θ of the target is 10°, 40° and 280° to 340°, there is no range of the length D1 in which the resonance points f1 and f2 can be adjusted. When the phase rotation amount θ of the target is 70° to 250°, there are ranges of the length D1 in which the resonance points f1 and f2 can be adjusted. When the phase rotation amount θ of the target is 70° to 160°, the minimum value of the length D1 is 5.4°. When the phase rotation amount θ of the target is 190° and 220°, the minimum value of the length D1 in which the resonance points f1 and f2 can be adjusted is 6.4°. When the phase rotation amount θ of the target is 250°, the minimum value of the length D1 in which the resonance points f1 and f2 can be adjusted is 6.9°.

Step S9: The length D2 of the transmission line 22 is fixed to 0°, the inductance L2 and the length D1 of the transmission line 20 are changed, and the resonance point f1 is adjusted to the fundamental wave 3.5 GHz. After that, the resonance point f2 is adjusted using the inductance L1. The minimum value of the length D1 in which the phase rotation amount θ can be set to the target 160° is determined. Each value of the result of step S9 is as follows.

L1: 2.9 nH
L2: 10 nH
C1: 0.07 pF (fixed)
C2: 7 pF (fixed)
D1: 8.4°
D2: 0° (fixed)

Figure 24A:
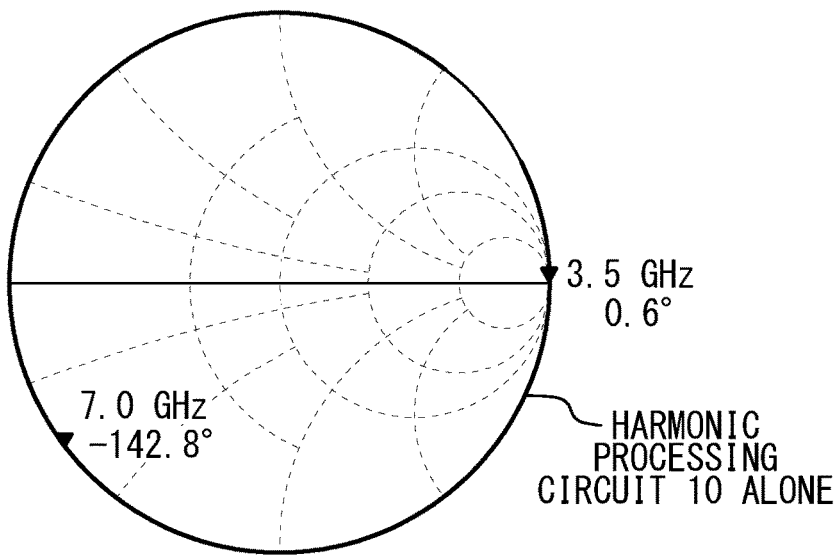
FIGS. 24A to 24C are diagrams illustrating a simulation result of step S9 in the simulation 6.
Figure 24B:
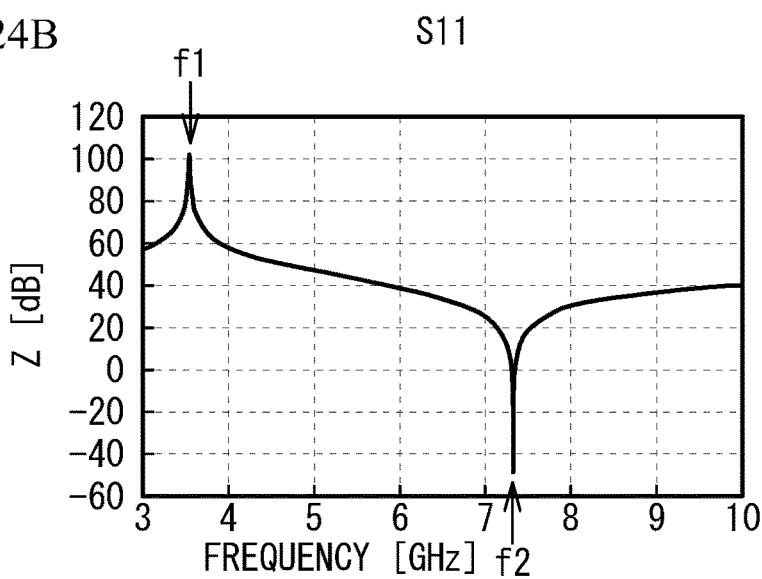
Figure 24C:
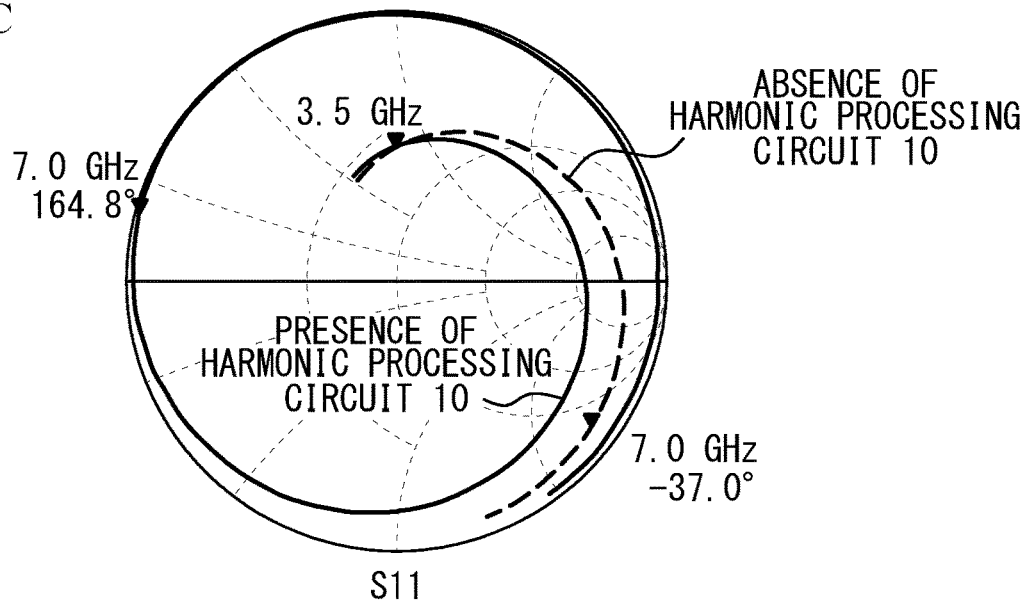

FIGS. 24A to 24C are diagrams illustrating a simulation result of step S9 in the simulation 6. As illustrated in FIG. 24A, the phase of S11 at 3.5 GHz is 0.6°, and the phase of S11 at 3.5 GHz is in the range of ±2° from the target 0°. The phase of S11 at the second harmonic 7.0 GHz is −142.8°. As illustrated in FIG. 24B, the resonance point f1 is approximately 3.5 GHz. The resonance point f2 is 7.3 GHz. As illustrated in FIG. 24C, the phases of S11 at the second harmonic 7.0 GHz are −37.0° and 164.8° (−195.2°) in the absence and the presence of the harmonic processing circuit 10, respectively. The phase rotation amount θ is 158.2°, which is in the range of ±4° from the target 160°.

The phase rotation amount θ of the second harmonic of the target was changed, and the length D1 of the transmission line 20 in which the resonance points f1 and f2 can be adjusted was simulated when the length D2 of the transmission line 22 was 0° in the same manner as step S9. FIG. 23B illustrates a case where the length D2 of the transmission line 22 is set to 0°. As illustrated in FIG. 23B, when the phase rotation amount θ of the target is 10°, 40° and 340°, there is no range of the length D1 in which the resonance points f1 and f2 can be adjusted. When the phase rotation amount θ of the target is 70° to 310°, the minimum value of the length D1 in which the resonance points f1 and f2 can be adjusted is 8.4°.

Step S10: When the length D2 of the transmission line 22 is set to 0° to 5°, the inductance L2 and the length D1 of the transmission line 20 are changed, and the resonance point f1 is adjusted to the fundamental wave 3.5 GHz. After that, the resonance point f2 is adjusted using the inductance L1. The minimum value of the length D1 in which the phase rotation amount θ can be set to the target 160° is determined.

The phase rotation amount θ of the second harmonic of the target was changed, and the length D1 of the transmission line 20 in which the resonance points f1 and f2 can be adjusted was simulated when the length D2 of the transmission line 22 was 0° to 5° in the same manner as step S10. FIG. 23C illustrates a case where the length D2 of the transmission line 22 is set to 0° to 5°. As illustrated in FIG. 23C, when the phase rotation amount θ of the target is 10°, 40° and 340°, there is no range of the length D1 in which the resonance points f1 and f2 can be adjusted. When the phase rotation amount θ of the target is 70° to 310°, there are ranges of the length D1 in which the resonance points f1 and f2 can be adjusted. The maximum value of the length D1 is 19.4°. The minimum value of the length D1 is 2.9° to 6.9°.

When the parasitic capacitance component of the chip inductor is used as the capacitor C1 as in the simulation 6, the minimum value of the length D1 of the transmission line 20 exists. When the length D2 of the transmission line 22 is lengthened, the length D1 of the transmission line 20 is shortened. When the length D2 of the transmission line 22 is shortened, the length D1 of the transmission line 20 is lengthened.

The length D2 of the transmission line 22 may be longer or shorter depending on the layout of each component on the substrate. For example, when the length D2 of the transmission line 22 is 8° (1.14 mm at 3.5 GHz), the minimum value of the length D1 of the transmission line 20 is 5.4° as illustrated in FIG. 23A. When the length D2 of the transmission line 22 is 0°, the minimum value of the length D1 of the transmission line 20 is 8.4° as illustrated in FIG. 23B.

In FIG. 23A, when the length D2 of the transmission line 22 corresponds to 9° or less of the phase of the fundamental wave, the length D1 of the transmission line 20 corresponds to 2.9° or more of the phase of the fundamental wave. Thereby, the resonance points f1 and f2 can be adjusted to the fundamental wave and the second harmonic. The length D1 is preferably 3° or more, more preferably 4° or more, and even more preferably 5° or more of the phase of the fundamental wave. The length D1 is preferably 20° or less.

From FIG. 23B, one end of the inductor L1 is connected to the line 18 without passing through the transmission line 22. At this time, the length D1 of the transmission line 20 corresponds to 8° or more of the phase of the fundamental wave. Thereby, the resonance points f1 and f2 can be adjusted to the fundamental wave and the second harmonic. FIG. 23B illustrates the simulation result when the length D2 is 0°, but if the length D2 is very small (for example, 1° or less, or 0.5° or less), the result of FIG. 23B can be applied. Therefore, when one end of the inductor L1 is connected to the line 18 via the transmission line 22 having the length D2 corresponding to 1° or less of the phase of the fundamental wave, the length D1 of the transmission line 20 may correspond to 8° or more of the phase of the fundamental wave. The length D1 is preferably 8.5° or more, and more preferably 9° or more of the phase of the fundamental wave. The length D1 is preferably 20° or less.

Figure 25:
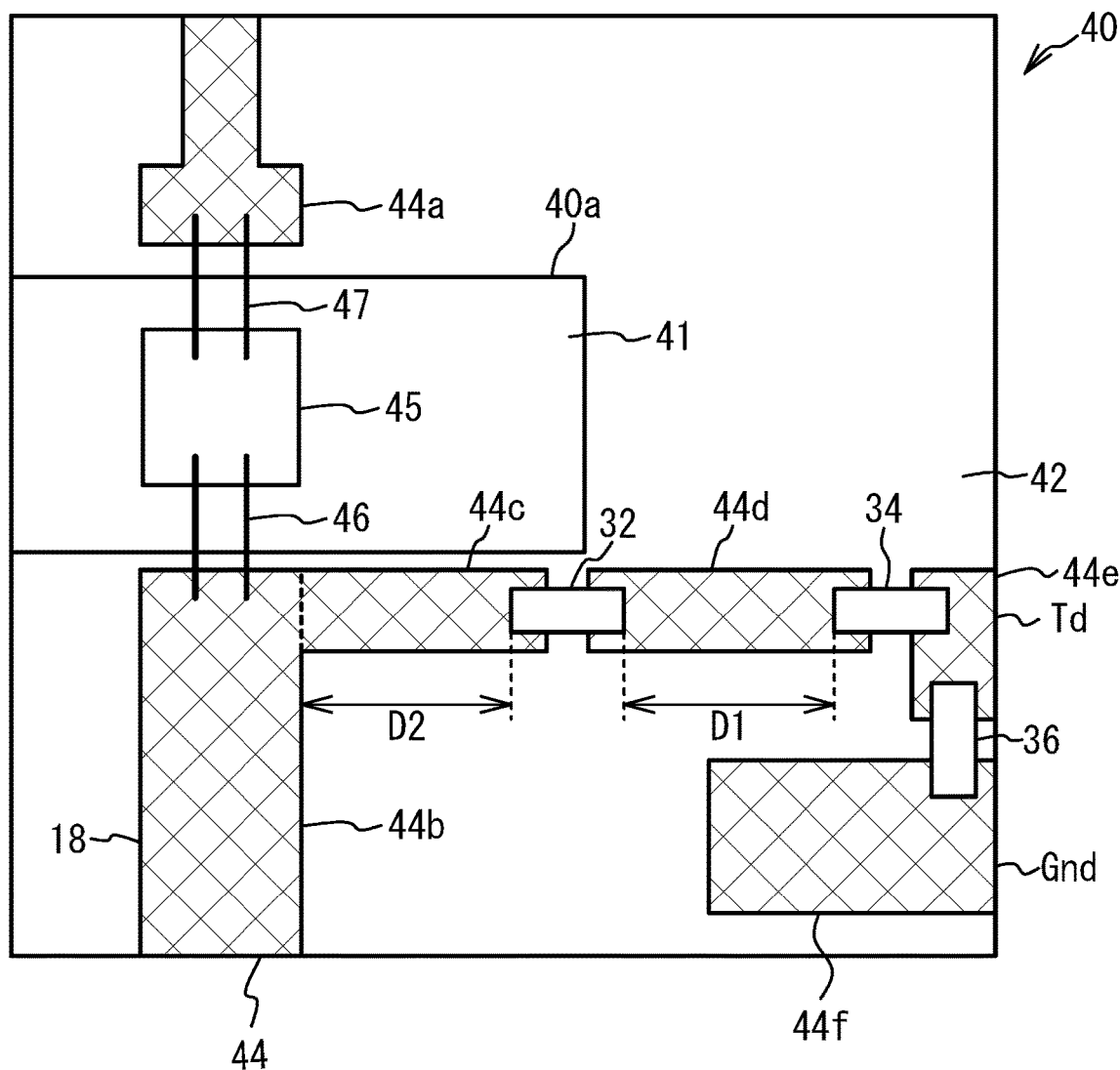
FIG. 25 is a plan view illustrating an example of an amplification device according to the second embodiment.

FIG. 25 is a plan view illustrating an example of the amplification device according to the second embodiment. FIG. 25 illustrates an example in which the length D2 of the transmission line 22 is set to 8°. As illustrated in FIG. 25, in a substrate 40, a dielectric substrate 42 is bonded to a conductor substrate 41. The conductor substrate 41 is a metal substrate such as a laminated substrate of Cu and Mo. The dielectric substrate 42 is, for example, a resin substrate such as FR-4 or a ceramic substrate. The conductor substrate 41 is provided with an opening 40a, and a semiconductor chip 45 is mounted on the conductor substrate 41 in the opening 40a. The semiconductor chip 45 is provided with the amplifier 16.

A conductor pattern 44 is formed on the dielectric substrate 42. The conductor pattern 44 is a metal layer such as Cu or Au. Patterns 44a to 44f are provided as the conductor pattern 44. The patterns 44a to 44d and the conductor pattern 44 form a microstrip line. The pattern 44a is an input pattern and is connected to the matching circuit 14. The pattern 44b is an output pattern and is connected to the matching circuit 12. An input pad of the semiconductor chip 45 and the pattern 44a are connected by a bonding wire 47. An output pad of the semiconductor chip 45 and the pattern 44a are connected by a bonding wire 46. The bonding wires 46 and 47 are metal wires such as Au or Al. The bonding wire 46 corresponds to the inductor L02.

The pattern 44c branches from the pattern 44b. The pattern 44c corresponds to the transmission line 22. Patterns 44d, 44e and 44f correspond to the transmission line 20, the node N4 and the ground Gnd, respectively. One end of a chip inductor 32 is bonded to the other end of the pattern 44c, and the other end of the chip inductor 32 is bonded to one end of the pattern 44d. One end of a chip inductor 34 is bonded to the other end of the pattern 44d, and the other end of the chip inductor 34 is bonded to the other end of the pattern 44e. One end of a chip capacitor 36 corresponding to the capacitor C2 is bonded on the pattern 44e, and the other end of the chip capacitor 36 is bonded on the pattern 44f. A silver paste or a brazing material such as a solder is used to bond the patterns 44c to 44f to the chip inductors 32 and 34 and the chip capacitor 36. An electrical length in the pattern 44c between a branch point between the patterns 44b and 44c and a location where one end of the chip inductor 32 is bonded to the pattern 44c corresponds to the length D2 of the transmission line 22. An electrical length in the pattern 44d between a location where the other end of the chip inductor 32 is bonded to the pattern 44d and a position where one end of the chip inductor 34 is bonded to the pattern 44d corresponds to the length D1 of the transmission line 20.

As illustrated in FIG. 23A, when the frequency of the fundamental wave is 3.5 GHz and the length D2 of the transmission line 22 is 8°, the length D2 is 1 mm. At this time, the length D1 of the transmission line 20 is 6.9° or more. The length D1 is, for example, 1 mm. In order to reduce the size, the length D1 of the transmission line 20 is generally shortened. However, in the second embodiment, the length D1 of the transmission line 20 is set to a constant value or more.

Figure 26:
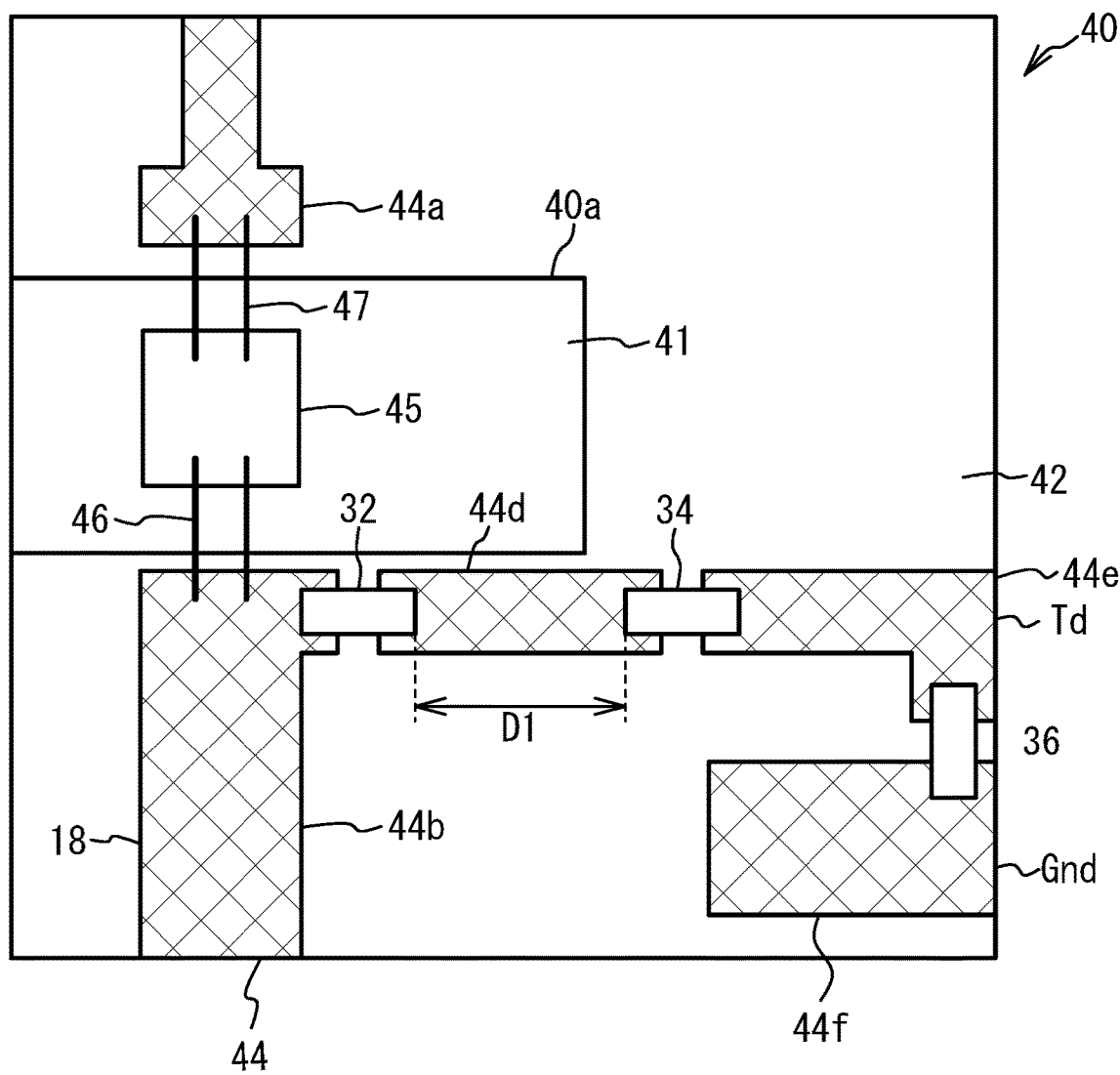
FIG. 26 is a plan view illustrating another example of an amplification device according to the second embodiment.

FIG. 26 is a plan view illustrating another example of an amplification device according to the second embodiment. FIG. 26 illustrates an example in which the length D2 of the transmission line 22 is set to 0°. As illustrated in FIG. 26, the pattern 44c is not provided, and the chip inductor 32 is bonded to a protrusion portion of the pattern 44b. Other configurations are the same as those in FIG. 25, and the description thereof will be omitted.

As illustrated in FIG. 23B, when the length D2 of the transmission line 22 is 0°, the length D1 of the transmission line 20 is 8.4° or more. The length D1 is, for example, 1.2 mm. In this way, shortening the transmission line 22 increases the length D1 of the transmission line 20. That is, the length D1 of the transmission line 20 is longer than the length D2 of the transmission line 22.

As illustrated in FIGS. 25 and 26, the chip inductors 32 and 34 are mounted on the dielectric substrate 42. The other end of the inductor L1 is bonded to one end of the transmission line 20, and one end of the inductor L2 is bonded to the other end of the transmission line 20. Thereby, the harmonic processing circuit of the second embodiment can be realized.

Third Embodiment

Figure 27:
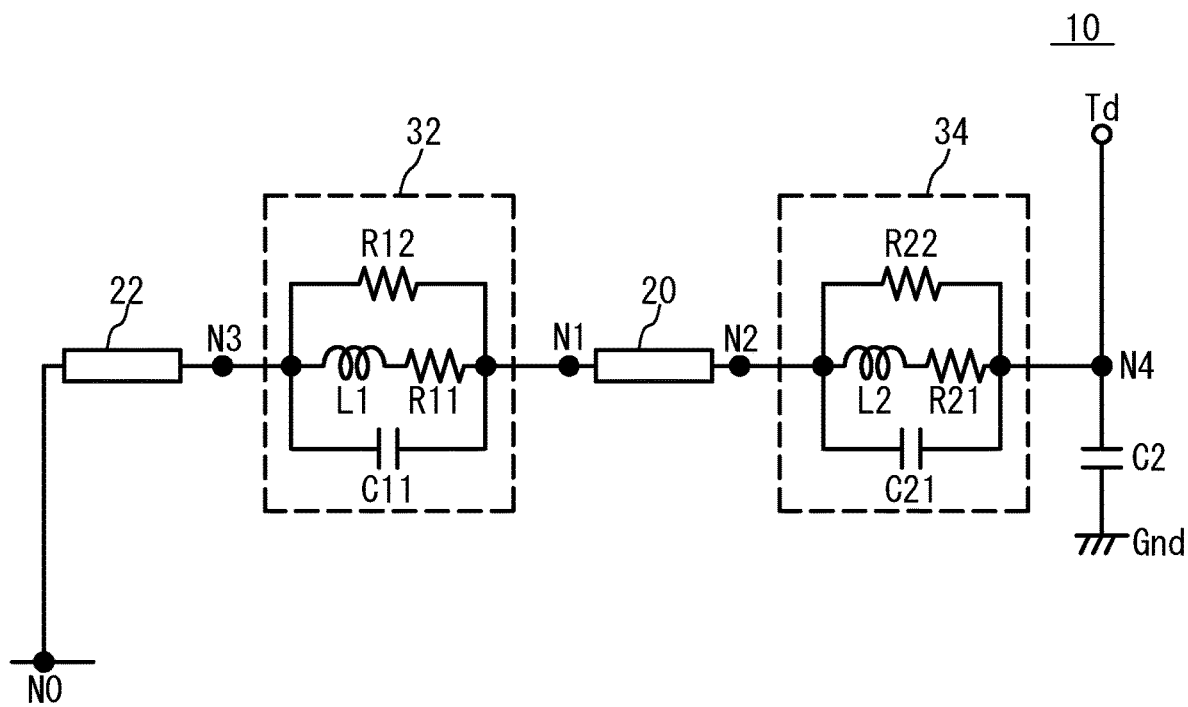
FIG. 27 is a circuit diagram illustrating a harmonic processing circuit according to the third embodiment.

A third embodiment is an example in which chip inductors are used as the inductors L1 and L2. The third embodiment is an example in which the resistance component is also considered as an equivalent circuit of the chip inductors. FIG. 27 is a circuit diagram illustrating the harmonic processing circuit according to the third embodiment. As illustrated in FIG. 27, the chip inductors 32 and 34 are used as the inductors L1 and L2. The chip inductors 32 and 34 are discrete chip components. The chip inductor 32 is connected between the nodes N3 and N1, and the chip inductor 34 is connected between the nodes N2 and N4. The series resistances of the inductors L1 and L2 are R11 and R 21, the parallel resistors are R12 and R22, and the parasitic capacitance components are C11 and C21. C21 is used as the capacitor C1. Other configurations are the same as those in the second embodiment.

Even if the inductances L1 and L2 of the chip inductors 32 and 34 are changed, the resistors R11, R12, R21, R22, and the parasitic capacitance components C11 and C21 become substantially constant.

Simulation 7

Assuming that the values of the inductance or the like of the components are discrete in a third comparative example in which the transmission lines 20 and 22 are not provided and a third embodiment in which the transmission lines 20 and 22 are provided, the conditions in which the phase of the second harmonic approaches the maximum efficiency of 176.5° were simulated by using the optimization function of the simulator, as in the simulation 3.

The simulation conditions are as follows.
Frequency of fundamental wave: 3.5 GHz
Frequency of second harmonic: 7.0 GHz
Harmonic processing circuit 10
L1: 0.6 nH to 6 nH, in increments of 0.1 nH
L2: 6 nH to 10 nH, in increments of 0.5 nH
C2: 7 pF (fixed)
C11, C21 (C1): 0.07 pF (fixed)
R11, R21: 0.1Ω (fixed)
R12, R22: 15000Ω (fixed)
Characteristic impedance of transmission lines 20 and 22: 50Ω
The matching circuit 12 is the same as the matching circuit 12 in the simulation 3.
Each of optimized values is as follows.
Third comparative example
L1: 4.9 nH
L2: 9.5 nH
C2: 7 pF (fixed)
C11, C21 (C1): 0.07 pF (fixed)
R11, R21: 0.1Ω (fixed)
R12, R22: 15000Ω (fixed)
Third embodiment
L1: 1.4 nH
L2: 7.5 nH
C2: 7 pF (fixed)
C11, C21 (C1): 0.07 pF (fixed)
R11, R21: 0.1Ω (fixed)
R12, R22: 15000Ω (fixed)
D1: 13°
D2: 0°

The phase and the efficiency of S11 at the second harmonic 7.0 GHz in the third comparative example and the third embodiment are as follows.
Third comparative example
Phase: −45.1°
Efficiency: 61.7%
Third embodiment
Phase: 176.5°
Efficiency: 65.5%

Even if the resistance component is taken into consideration in the equivalent circuit of the chip inductor as in the simulation 7, it is possible to adjust the resonance points f1 and f2 to the fundamental wave and the second harmonic by using the transmission lines 20 and 22.

In the simulations 1 to 7, the frequency of the fundamental wave is set to 3.5 GHz. The lengths D1 and D2 of the transmission lines 20 and 22 are represented by the phase angle of the fundamental wave, and the results of the simulations 1 to 7 can be applied even if the frequency of the fundamental wave is other than 3.5 GHz. In particular, when the frequency of the fundamental wave is 0.5 GHz to 10 GHz, the values of the inductors L1 and L2 and the capacitors C1 and C2 do not differ greatly from the values of the simulation, and the simulations 1 to 7 can be more applied. When the frequency of the fundamental wave is 1 GHz to 5 GHz, the simulations 1 to 7 can be further applied.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A harmonic processing circuit comprising:
    a first inductor having a first end connected to a connection line connected between an amplifier and an impedance matching circuit, and a second end connected to a first node;
    a first transmission line having a third end connected to the first node and a fourth end connected to a second node; and
    a parallel resonant circuit having a fifth end connected to the second node and a sixth end connected to a reference potential, wherein a second inductor and a first capacitor are connected in parallel between the fifth end and the sixth end;
    wherein when the first inductor is viewed from the connection line, an impedance at a frequency of a fundamental wave amplified by the amplifier is larger than an impedance at a frequency of a second harmonic having twice the frequency of the fundamental wave.

2. The harmonic processing circuit according to claim 1, further comprising:
    a second transmission line having a seventh end connected to the connection line and an eighth end connected to a third node;
    wherein the first end of the first inductor is connected to the third node,
    a length of the first transmission line corresponds to 45° or less of a phase of the fundamental wave, and a length of the second transmission line corresponds to 9° or less of the phase of the fundamental wave.

3. The harmonic processing circuit according to claim 1, wherein
    the second inductor is a chip inductor, and the first capacitor is a parasitic capacitance component of the chip inductor.

4. The harmonic processing circuit according to claim 3, wherein
    a length of the first transmission line corresponds to 2.9° or more of a phase of the fundamental wave.

5. The harmonic processing circuit according to claim 1, wherein
    the second inductor is a chip inductor, and the first capacitor is a parasitic capacitance component of the chip inductor,
    a length of the first transmission line corresponds to 8° or more of a phase of the fundamental wave, and
    the first end of the first inductor is directly connected to the connection line, or is connected to the connection line via a second transmission line having a length corresponding to 1° or less of the phase of the fundamental wave.

6. The harmonic processing circuit according to claim 1, wherein
    the second inductor has a ninth end connected to a bias terminal that supplies a bias voltage to the amplifier.

7. The harmonic processing circuit according to claim 6, further comprising:
    a second capacitor having a tenth end connected to a fourth node between the sixth end of the second inductor and the bias terminal, and an eleventh end connected to the reference potential.

8. An amplification device comprising:
    the harmonic processing circuit as claim in claim 1; and
    the amplifier.

* * * * *